United States Patent
Berman et al.

(10) Patent No.: US 12,107,606 B1
(45) Date of Patent: Oct. 1, 2024

(54) POLAR SUBCODES ENCODER WITHOUT THE DEMAND FOR DOMINATION FOR SCALABLE HIGH THROUGHPUT ENCODING

(71) Applicant: SAMSUNG ELECTRONICS CO., LTD., Suwon-si (KR)

(72) Inventors: Amit Berman, Suwon-si (KR); Idan Dekel, Suwon-si (KR); Ariel Doubchak, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/143,429

(22) Filed: May 4, 2023

(51) Int. Cl.
 *H03M 13/13* (2006.01)
(52) U.S. Cl.
 CPC .................................. *H03M 13/13* (2013.01)
(58) Field of Classification Search
 CPC ..................................................... H03M 13/13
 See application file for complete search history.

(56) References Cited

FOREIGN PATENT DOCUMENTS

| CA | 3076271 A1 * | 3/2019 | ............ H03M 13/09 |
|---|---|---|---|
| WO | 2018192640 A1 | 10/2018 | |

OTHER PUBLICATIONS

Communication dated Mar. 4, 2024 issued by the European Patent Office in European Application No. 23193897.8.
Huawei et al., "Channel coding for control channels", 3GPP TSG RAN WG1 Meeting #86, R1-167216, Gothenburg, Sweden, Aug. 22-26, 2016 (8 pages total).
Morozov et al., "Successive and Two-Stage Systematic Encoding of Polar Subcodes", IEEE Wireless Communications Letters, Jun. 2019, vol. 8, No. 3, pp. 877-880 (4 pages total).
Li et al., "Channel Estimation with Systematic Polar Codes", IEEE Transactions on Vehicular Technology, vol. 67, Issue 6, Feb. 15, 2018, pp. 1-11 (11 pages total).

\* cited by examiner

*Primary Examiner* — Samir W Rizk
(74) *Attorney, Agent, or Firm* — Sughrue Mion, PLLC

(57) ABSTRACT

Systems, devices, and methods for encoding information bits for storage, including obtaining an information vector comprising a plurality of information bits, a static frozen vector comprising a plurality of static frozen bits, and a constraints vector which indicates at least one constraint; partitioning the information vector into a first information vector and a second information vector; partitioning the static frozen vector into a first static frozen vector and a second static frozen vector; determining an input vector by applying a plurality of matrix operations to the first information vector, the second information vector, the first static frozen vector, the second static frozen vector, and the constraints vector; computing an output codeword of a polar subcode based on the input vector; and transmitting the output codeword to the storage device.

20 Claims, 16 Drawing Sheets

POLAR SUBCODES ENCODER WITHOUT THE DEMAND FOR DOMINATION FOR SCALABLE HIGH THROUGHPUT ENCODING

BACKGROUND

1. Field

Apparatuses and methods consistent with embodiments relate to managing a storage device, more particularly error correction coding using a systematic error correction code (ECC) encoder using polar subcodes.

2. Description of Related Art

Polar code is a linear block error correcting code which is constructed by transforming an actual physical n-length channel into n virtual channels. This is done using a recursion that partitions an input vector into two half-length output vectors. As the recursion becomes deeper, the virtual channels are polarized into high reliability and low reliability channels. A polar code encoder may choose where to allocate the information bits based on the reliability of the channels.

Polar codes are among the first types of codes with an explicit construction to achieve channel capacity for symmetric binary-input, discrete, memoryless channels (B-DMC). Consequently, they are capacity-achieving for symmetric channels, which include binary-input additive white Gaussian noise (AWGN), binary symmetric channels (BSC) and binary erasure channel BEC. Polar codes have relatively low time and space complexity for encoding and basic decoding, and are therefore practical in many different applications.

The error-correcting performance of polar codes improves slower with the blocklength than other widely-used codes, such as turbo codes and low-density parity check (LDPC) codes. However, polar codes have been shown to provide excellent error-correcting performance with low decoding complexity for practical blocklengths when combined with more advanced decoding algorithms. These favorable traits have led the 3rd Generation Partnership Project (3GPP) to adopt polar codes in the 5G new radio (NR) wireless standard. In addition, polar codes can also be useful in many other applications, such as memory storage applications.

A polar subcode is a polar code to which additional constraints are applied. Although some systematic encoders exist for polar subcodes, these encoders often have significant limitations which reduce their usefulness. Therefore, there is a need for an efficient systematic polar subcode encoder which is not subject to such limitations.

SUMMARY

According to an aspect of one or more embodiments, a storage system includes a storage device configured to store a plurality of codewords; at least one processor configured to: obtain an information vector comprising a plurality of information bits, a static frozen vector comprising a plurality of static frozen bits, and a constraints vector which indicates at least one constraint; partition the information vector into a first information vector and a second information vector; partition the static frozen vector into a first static frozen vector and a second static frozen vector; determine a first portion of an input vector based on the first information vector; determine an updated constraints vector based on the constraints vector, the first portion of the input vector, the second information vector, the first static frozen vector, and the second static frozen vector; determine a second portion of the input vector and a third portion of the input vector based on the updated constraints vector; determine a fourth portion of the input vector based on the first portion of the input vector, the second information vector, the second static frozen vector, and the third portion of the input vector; determine a fifth portion of the input vector based on the first static frozen vector; determine a sixth portion of the input vector based on the second static frozen vector; compute an output codeword based on the input vector; and store the output codeword in the storage device.

According to an aspect of one or more embodiments, a device for encoding information bits for storage in a storage device includes a memory interface configured to communicate with the storage device; and at least one processor configured to: obtain an information vector comprising a plurality of information bits, a static frozen vector comprising a plurality of static frozen bits, and a constraints vector which indicates at least one constraint; partition the information vector into a first information vector and a second information vector; partition the static frozen vector into a first static frozen vector and a second static frozen vector; determine an input vector by applying a plurality of matrix operations to the first information vector, the second information vector, the first static frozen vector, the second static frozen vector, and the constraints vector; compute an output codeword of a polar subcode based on the input vector; and control the memory interface to transmit the output codeword to the storage device.

According to an aspect of one or more embodiments, a method of controlling a storage system is executed by at least one processor and includes: obtaining an information vector comprising a plurality of information bits, a static frozen vector comprising a plurality of static frozen bits, and a constraints vector which indicates at least one constraint; partitioning the information vector into a first information vector and a second information vector; partitioning the static frozen vector into a first static frozen vector and a second static frozen vector; determining a first portion of an input vector based on the first information vector; determining an updated constraints vector based on the constraints vector, the first portion of the input vector, the second information vector, the first static frozen vector, and the second static frozen vector; determining a second portion of the input vector and a third portion of the input vector based on the updated constraints vector; determining a fourth portion of the input vector based on the first portion of the input vector, the second information vector, the second static frozen vector, and the third portion of the input vector; determining a fifth portion of the input vector based on the first static frozen vector; determining a sixth portion of the input vector based on the second static frozen vector; computing an output codeword based on the input vector; and storing the output codeword in the storage device.

According to an aspect of one or more embodiments, a method of encoding information bits for storage in a storage device is executed by at least one processor and includes: obtaining an information vector comprising a plurality of information bits, a static frozen vector comprising a plurality of static frozen bits, and a constraints vector which indicates at least one constraint; partitioning the information vector into a first information vector and a second information vector; partitioning the static frozen vector into a first static frozen vector and a second static frozen vector; determining an input vector by applying a plurality of matrix operations to the first information vector, the second information vector, the first static frozen vector, the second static frozen vector, and the constraints vector; computing an output codeword of a polar subcode based on the input vector; and transmitting the output codeword to the storage device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Embodiments of the present disclosure may relate methods for systematic encoding of polar subcodes. Accordingly, embodiments may be useful many storage technologies, for example Universal Flash Storage (UFS) storage devices. In addition, embodiments may be useful in many other technologies, for example data transmission and reception, data compression and decompression, data processing such as file conversion, and any other technology in which information is encoded and decoded.

Figure 1:
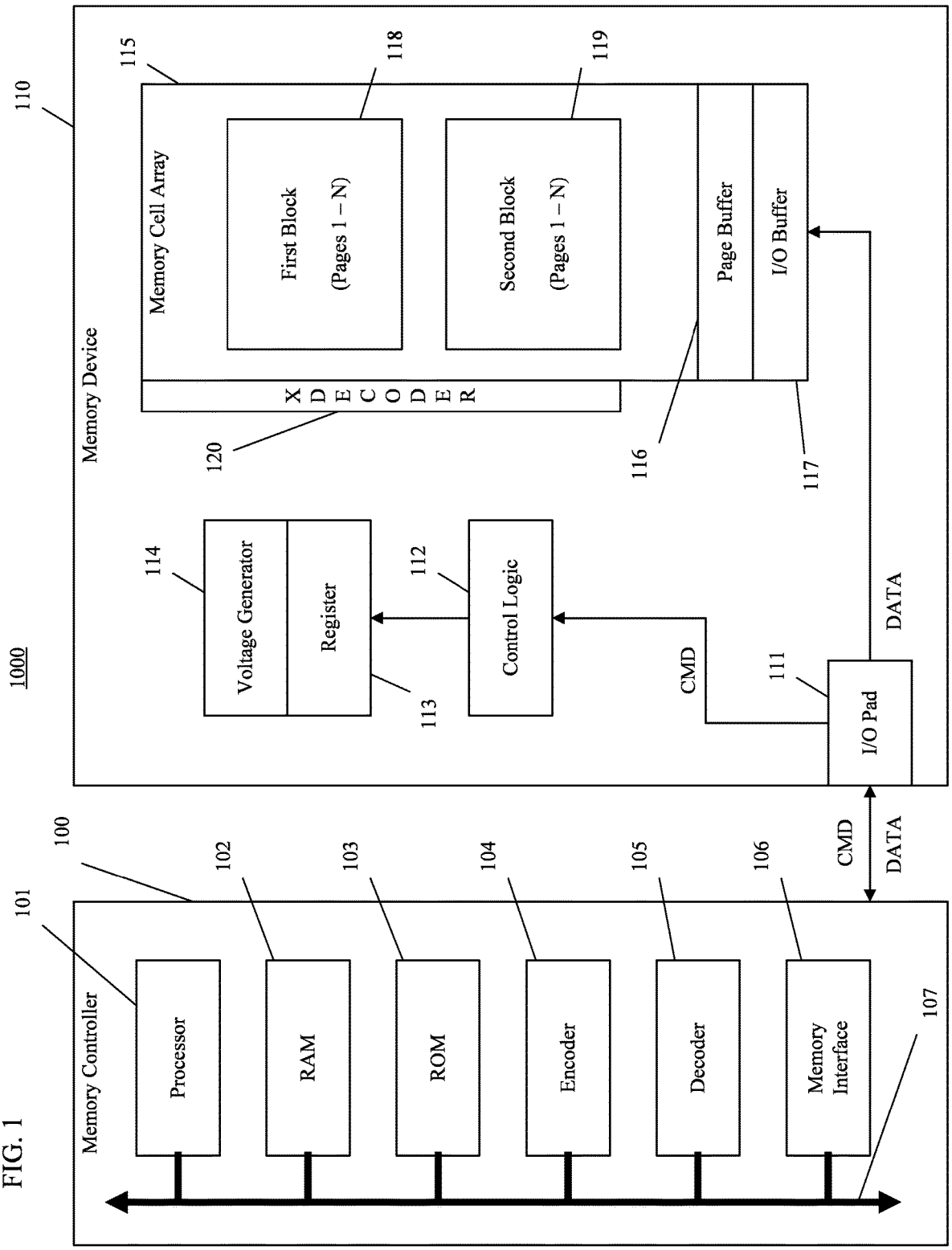
FIG. 1 is a block diagram of a memory system, according to embodiments.

FIG. 1 is a block diagram of a memory system, according to embodiments. Referring to FIG. 1, the memory system 1000 may include the memory controller 100 and a memory device 110, which may be a nonvolatile memory device.

The memory device 110 may be, but is not limited to, a flash memory device, a NAND flash memory device, a phase change RAM (PRAM), a ferroelectric RAM (FRAM), a magnetic RAM (MRAM), etc. According to embodiments, the memory device 110 may include a plurality of NAND flash memory devices. The memory device 110 may have a planar structure or a three-dimensional (3D) memory cell structure with a stack of memory cells.

The memory device 110 may include a memory cell array 115, an X Decoder 120, a voltage generator 114, an input/output (I/O) buffer 117, a page buffer 116, and a control logic 112 each of which may be implemented as one or more circuits. The memory device 110 may also include an I/O pad 111.

The memory cell array 115 may include a plurality of word lines and a plurality of bit lines. Each memory cell of the memory cell array 115 may be implemented as a nonvolatile memory cell. For example, each memory cell of the memory cell array 115 may have, for example, a floating gate or a charge storage layer such as a charge trapping layer.

The memory cell array 115 may include a plurality of blocks and a plurality of pages. Each block may include a plurality of pages. For example, a first block 118 may include a first plurality of pages 1-N while a second block 119 may include a second plurality of pages 1-N, where N is an integer greater than 1. A page may be a unit of program and read operations, and a block may be a unit of erase operation.

The control logic 112 may control the overall operation of the memory device 110. When receiving a command CMD from the memory controller 100, the control logic 112 may interpret the command CMD and control the memory device 110 to perform an operation (e.g., a program operation, a read operation, a read retry operation, or an erase operation) according to the interpreted command CMD.

The X Decoder 120 may be controlled by the control logic 112 and drive at least one of the word lines in the memory cell array 115 according to a row address.

The voltage generator 114 may be controlled by the control logic 112 to generate one or more voltages required for a program operation, a read operation or an erase operation and provide the generated voltages to one or more rows selected by the X Decoder 120.

The page buffer 116 may be controlled by the control logic 112 and operate as a sense amplifier or a write driver according to an operation mode (e.g., a read operation or a program operation).

The I/O pad 111 and the I/O buffer 117 may serve as I/O paths of data exchanged between an external device, e.g., the memory controller 100 or a host and the memory device 110.

The memory controller 100 may include a processor 101, a read-only memory (ROM) 103, a random access memory (RAM) 102, an encoder 104, a decoder 105, a memory interface 106, and a bus 107. The elements 101 through 106 of the memory controller 100 may be electrically connected to each other through the bus 107.

The processor 101 may control the overall operation of the memory system including the memory controller 100. The processor 101 may include a circuit that controls other elements by generating control signals. When power is supplied to the memory system, the processor 101 may drive firmware (e.g., stored in the ROM 103) for operating the memory system on the RAM 102, thereby controlling the overall operation of the memory system. According to embodiments, the processor 101 may also issue instructions for controlling operations of other elements of the memory controller 100 including, for example, some or all of the ROM 103, RAM 102, encoder 104, decoder 105, memory interface 106, and a bus 107. According to embodiments, any operations described herein as being performed by the memory controller 100 may be performed by, or under the control of, the processor 101. According to embodiments, any operations described herein as being performed by the memory controller 100 may be performed by, or under the control of, the processor 101 executing instructions that correspond to the operations and are included in program code (e.g., stored in the ROM 103).

A driving firmware code of the memory system may be stored in the ROM 103, however embodiments are not limited thereto. The firmware code can also be stored in a portion of the memory device 110. Therefore, the control or intervention of the processor 101 may encompass not only the direct control of the processor 101 but also the intervention of firmware which is software driven by the processor 101.

The RAM 102, which may include a memory serving as a buffer, may store an initial command, data, and various variables input from a host or the processor 101, or data output from the memory device 110. The RAM 102 may store data and various parameters and variables input to and output from the memory device 110.

The memory interface 106 may serve as an interface between the memory controller 100 and the memory device 110. The memory interface 106 is connected to the I/O pad 111 of the memory device 110 and may exchange data with the I/O pad 111. In addition, the memory interface 106 may create a command suitable for the memory device 110 and provide the created command to the I/O pad 111 of the memory device 110. The memory interface 106 provides a command to be executed by the memory device 110 and an address ADD of the memory device 110.

According to embodiments, the decoder 105 may be an error correcting code (ECC) decoder configured to decode data in the manner described above, and the encoder 104 may be an ECC encoder configured to encode data in the manner described above. According to embodiments, the decoder 105 and the encoder 104 may perform error bit correction in the manner described above. The encoder 104 may generate data added with one or more parity and/or redundancy bits by performing error correction encoding on data before the data is provided to the memory device 110. The one or more parity and/or redundancy bits may be stored in the memory device 110.

The decoder 105 may perform error correction decoding on output data, determine whether the error correction decoding is successful based on the result of the error correction decoding, and output an instruction signal based on the determination result. Read data may be transmitted to the decoder 105, and the decoder 105 may correct error bits of the data using the one or more parity and/or redundancy bits.

In embodiments, the encoder 104 and the decoder 105 may encode and decode data using a polar code. A polar code of length $n=2^m$ and dimension k may have two sets of indexes, for example an information index set $\alpha$, which may contain k indexes, and a frozen index set $\phi$, which may contain n−k indexes, such that $\alpha \cup \phi = [0 \ldots n-1]$, $|\alpha \cap \phi|=0$. In embodiments, n may represents a length of a polar codeword, and k may represent a number of information bits included in the polar codeword. A polar(n, k) code may be a set of vectors which satisfy Equation 1 and Equation 2 below:

$$x=uG \qquad \text{Equation 1}$$

$$u[\phi]=f \qquad \text{Equation 2}$$

As used in Equation 1 and Equation 2, x may represent a polar codeword, u may represent an input vector, G may represent the generator matrix of the polar code, and f may represent a frozen vector having length n−k. In embodiments, the frozen vector f may be set to any value, for example f=0. In embodiments, the polar generator matrix G may be expressed according to Equation 3 below:

$$G=BF^{\otimes m} \qquad \text{Equation 3}$$

In Equation 3 above, B may represent a bit-reversal permutation matrix, $m=\log_2 n$, and $F^{\otimes m}$ may represent Arikan's kernel, which may be a Kronecker product of a matrix F with itself, performed m-times, where the matrix F may be expressed according to Equation 4 below:

$$F = \begin{bmatrix} 1 & 0 \\ 1 & 1 \end{bmatrix} \qquad \text{Equation 4}$$

In embodiments, the bit reversal permutation matrix B may permute rows according to a bit-reversal function. In embodiments, a vector i having a binary representation $<i>_b=[i_0, i_1, \ldots, i_{m-1}]$ may be mapped by the bit-reversal function to $<\text{bitReversal}(i)>_b=[i_{m-1}, \ldots, i_1, i_0]$. For example $<3>_b=[0,0,0,0,0,0,1,1]$ may be mapped by the bit-reversal function to $<384>_b=[1,1,0,0,0,0,0,0]$.

In embodiments, a polar encoder may encode an information vector i into an output codeword x according to Equation 5 below:

$$x=\text{SimpleEnc}(i)$$

The encoder may be referred to as systematic if the information vector i is embedded in the output codeword x at a known set of indexes infoSet, such that x[infoSet]=u. Many common simple polar encoders may set the infoSet to be a bit reversal mapping of the information set in the vector u, such that infoSet=BR($\alpha$).

Linear codes may have a systematic encoder with complexity of O(n·k), which may be less efficient than the available encoders for regular polar encoders which operate in O(n·log(n)) due to their efficient usage of the polar generator matrix G.

A polar subcode may be a set of vectors which satisfy Equation 1 and Equation 2 above, and also satisfy additional L affine constraints which may be expressed using a constraints matrix P and a constraints vector d according to Equation 5 below:

$$xP_{n \times L}=d_L \qquad \text{Equation 5}$$

In embodiments, the constraints vector d may be set to any value, for example d=0.

In embodiments, a leading ones index may be an index of a last entry having a value of one ("1") in a column of the constraints matrix P. For each column j=0 . . . L−1, the leading ones index may be the index of the lowest one, such that no ones are present below it in the column. In embodiments, the constraints matrix P may be in reduced form, for example in a form in which no two rows have the same leading ones index. In embodiments, one or more columns operations may be applied to the constraints matrix P in order to place it in reduced form.

In embodiments, a leading ones index set w for the matrix W shown in Equation 6 below may be w={6,7,4,1,1}.

$$W = \begin{bmatrix} 0 & 1 & 0 & 1 & 1 \\ 1 & 0 & 1 & 1 & 1 \\ 0 & 1 & 0 & 0 & 0 \\ 0 & 1 & 1 & 0 & 0 \\ 0 & 1 & 1 & 0 & 0 \\ 1 & 0 & 0 & 0 & 0 \\ 1 & 0 & 0 & 0 & 0 \\ 0 & 1 & 0 & 0 & 0 \end{bmatrix} \qquad \text{Equation 6}$$

In embodiments, a dynamic frozen index set δ, which may be defined for polar subcodes, may include all of the leading ones indexes of the information index set α and the static frozen index set φ, which are then removed from the information index set α and the static frozen index set φ. The indexes included in the dynamic frozen index set δ may indicate bits in the input vector u which are responsible for satisfying Equation 5 above. In embodiments, the dynamic frozen index set δ may not be known in advance.

In embodiments, a vector y may be said to dominate a vector z, denoted as y ⪰ z, if for every zero bit in the binary representation of y, a corresponding bit in the vector z has a zero at the same place as well. In embodiments, the dominance of the vector y over the vector z may be expressed according to Equation 7 below:

$$y \succeq z \Leftrightarrow (y[t]=0 \Rightarrow z[t]=0,\ 0 \le t < m) \qquad \text{Equation 7}$$

Figure 2:
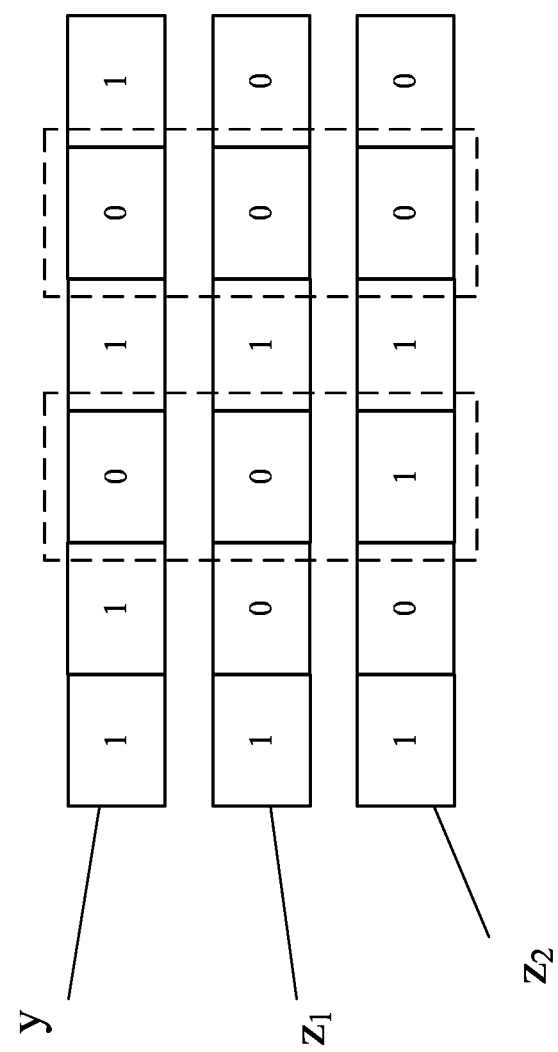
FIG. 2 illustrates an example of vectors which relate to a domination property, according to embodiments.

FIG. 2 illustrates an example of vectors which relate to dominance, according to embodiments. For example, as shown in FIG. 2, the vector y may dominate the vector $z_1$, but the vector y may not dominate the vector $z_2$.

Related-art simple systematic polar code encoders and simple systematic polar subcode encoders may require their inputs to have a "polar domination property" in order to be systematic. For example, a polar code may satisfy the polar domination property if all indexes in the information index set α are not dominated by any index in the static froze index set φ. A polar subcode may satisfy the polar domination property if all indexes in the information index set α are not dominated by any index in the static frozen index set φ, and are not dominated by any index in the dynamic frozen index set δ. For polar subcodes, this demand is harsher and more difficult to satisfy because matrix P (and thus the dynamic frozen index set δ) may be outer constraints, and therefore may not be modifiable.

Accordingly, embodiments may provide an efficient systematic encoder for polar subcodes which do not satisfy the polar domination property, for example polar subcodes in which there are indexes in at least one of the dynamic frozen index set δ that static frozen index set φ which dominate one or more indexes in the information index set α. In addition, the efficient systematic encoder for polar subcodes according to embodiments may further satisfy the condition that x[BR(α)]=u.

Accordingly, embodiments may relate to methods for encoding polar subcodes without the limitation of the domination property. In particular, two example schemes according to embodiments are discussed in greater detail below. Embodiments according to both of these schemes may provide polar subcode encoders which may be only slightly more complicated than the encoders discussed above, but which are capable of operating in a greater number of applications. In addition, both of the schemes according to embodiments may be capable of enforcing the requirement that that the indexes of the information bits in the codeword x are located at the bit reversal locations BR(α), as in the encoders discussed above.

In embodiments, the first scheme may split an input vector u into 6 different sections and compute each section separately, according to a formula corresponding to the section. The first scheme may have a significant complexity advantage over other encoding schemes when the number of indexes that do not meet the domination condition is small, meaning that the number of information bits which are dominated by dynamic frozen bits (and the number of dynamic frozen bits that dominate information bits) is small. This may be the case for many configurations of Polar-Bose-Chaudhuri-Hocquenghem (BCH) subcode, for example.

The second scheme may use an efficient polar encoder twice, and enforce the additional demands of the polar subcode using several special bits referred to as balance bits, which may be added to the input information bits.

According to embodiments, both of these example schemes may involve off-line preparation of matrices that can be computed once the index sets are known. These predetermined matrices may reduce the complexity of the encoders.

Figure 3:
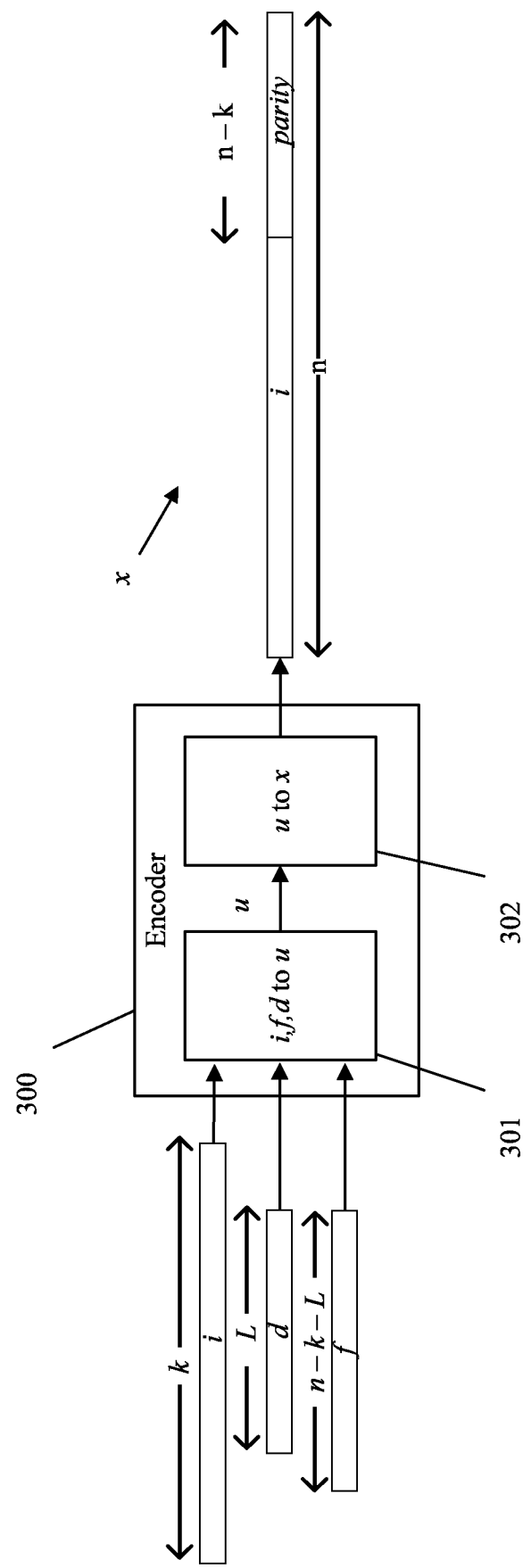
FIG. 3 is a block diagram of an encoder for encoding information bits to generate an output codeword according to a first example scheme, according to embodiments.

FIG. 3 is a block diagram of an example of an encoder 300 for encoding information bits to generate an output codeword according to the first scheme, according to embodiments. In embodiments, the encoder 500 may correspond to the encoder 104, and may include an input vector module 301 and codeword module 302. In embodiments, the input vector module 301 may receive as input the information vector i, which may have length k, the constraints vector d, which may have length L, and the frozen vector f, which may have length n−k−L. The input vector module 301 may generate an input vector u, as described in greater detail below, and may provide the input vector u to the codeword module 302, which may generate the output codeword x. As shown in FIG. 3, the output codeword x may include a parity vector parity, which may be generated by the encoder 300 based on the input vector u. Although FIG. 3 illustrates bits of the information vector i arranged together at a left of the output codeword x, and illustrates bits of the parity vector parity arranged together at a right of the codeword c, embodiments are not limited thereto. For example, in embodiments each of the bits may be placed at any position throughout the output codeword x.

According to embodiments, the encoder 300, operating according to the first scheme, may provide low complexity encoding by partitioning the input vector u into six different sections corresponding to six different index sets, and applying a specific formula for each section. This may be accomplished by dividing the matrix F to submatrices using the index sets, which may allow the encoder to perform only the minimum operations needed for each section.

In embodiments, the index sets may include a first information index set α, which may include indexes of the input vector u which are included in the information vector i and which are not dominated by any frozen index, for example any index in the index sets φ, δ, ε, and γ discussed below. The index sets may further include a second information index set β, which may include indexes of the input vector u which are included in the information vector i and which are dominated by at least one frozen index. In embodiments, the first information index set α and the second information index set β may satisfy Equation 8 below:

$$|\alpha|+|\beta|=k \qquad \text{Equation 8}$$

The index sets may include a first dynamic frozen index set δ, which may include indexes of the input vector u which are leading ones indexes included in the information vector i and the static frozen vector f and which do not dominate any information index, for example any index in the index sets α and β. The index sets may further include a second dynamic frozen index set ϵ, which may include indexes of the input vector u which are leading ones indexes in the information vector i and the static frozen vector f and which dominate at least one information index. In embodiments, the first dynamic frozen index set δ and the second dynamic frozen index set ϵ may satisfy Equation 9 below:

$$|\delta|+|\epsilon|=L \qquad \text{Equation 9}$$

The index sets may include a first static frozen index set ϕ, which may include indexes of the input vector u which are included in the static frozen vector f and which are not dominated by any frozen index. The index sets may further include a second static frozen index set γ, which may include indexes of the input vector u which are included in the static frozen vector f and which dominate at least one information index. In embodiments, the first static frozen index set ϕ and the second static frozen index set γ may satisfy Equation 10 below:

$$|\phi|+|\gamma|=n-k-L \qquad \text{Equation 10}$$

In embodiments, the index sets β, ϵ, and γ may be used to address situations in which the polar domination property does not hold.

In embodiments, the information index set may be split into two disjoint sets. As a result, the information vector i may be split into i=[i$^{(\alpha)}$, i$^{(\beta)}$], such that i[α]=i$^{(\alpha)}$, and i[β]=i$^{(\beta)}$. In embodiments, the encoder 300 may require that in the output codeword x, the bits of the information vector i must be located such that x[BR(α)]=i$^{(\alpha)}$ and x[BR(β)]=i$^{(\beta)}$. In embodiments, this requirement may help to ensure that the encoder 300 is a systematic encoder, and that the encoder 300 satisfies the bit reversal requirement discussed above.

As discussed above, the encoder 300 may use a number of submatrices to perform encoding. As an example of submatrix notation, H [a, b] may represent a submatrix of a matrix H which may be obtained according index sets a and b. For example, the submatrix H[a, b] may include only the rows of the matrix H with indexes in the index set a and the columns of the matrix H with indexes in the index set b. Equation 11 below provides an example of a matrix H, and Equation 12 below provides an example of a submatrix H[a, b] for which a={0,3,4}, b={1,4}:

$$H = \begin{bmatrix} 0 & 1 & 2 & 3 & 4 \\ 10 & 11 & 12 & 13 & 14 \\ 20 & 21 & 22 & 23 & 24 \\ 30 & 31 & 32 & 33 & 34 \\ 40 & 41 & 42 & 43 & 44 \end{bmatrix} \qquad \text{Equation 11}$$

$$H[a, b] = \begin{bmatrix} 1 & 4 \\ 31 & 34 \\ 41 & 44 \end{bmatrix} \qquad \text{Equation 12}$$

As another example of submatrix notation, the submatrix H[a, :] may include only rows of the matrix H with indexes in the index set a, and all of the columns of the matrix H. Equation 12 below provides an example of the submatrix H[a, :] corresponding to the matrix H in Equation 11 above:

$$H[a, :] = \begin{bmatrix} 0 & 1 & 2 & 3 & 4 \\ 30 & 31 & 32 & 33 & 34 \\ 40 & 41 & 42 & 43 & 44 \end{bmatrix} \qquad \text{Equation 12}$$

In addition, the encoder 300 may use matrix permutations to perform encoding. As an example of matrix permutation notation, a matrix permutation $R_u$ may group rows of a matrix by sets when multiplied from the right, and a transposed matrix permutation $R_u^t$ groups columns of a matrix by sets when multiplied from the left.

Equation 13 below provides an example of permuting the matrix F using the matrix permutation $R_u$ and the transposed matrix permutation $R_u^t$:

$$R_u F R_u^t =$$

$$\begin{bmatrix} F[\alpha, \alpha] & F[\alpha, \beta] & F[\alpha, \phi] & F[\alpha, \gamma] & F[\alpha, \delta] & F[\alpha, \epsilon] \\ F[\beta, \alpha] & F[\beta, \beta] & F[\beta, \phi] & F[\beta, \gamma] & F[\beta, \delta] & F[\beta, \epsilon] \\ F[\phi, \alpha] & F[\phi, \beta] & F[\phi, \phi] & F[\phi, \gamma] & F[\phi, \delta] & F[\phi, \epsilon] \\ F[\gamma, \alpha] & F[\gamma, \beta] & F[\gamma, \phi] & F[\gamma, \gamma] & F[\gamma, \delta] & F[\gamma, \epsilon] \\ F[\delta, \alpha] & F[\delta, \beta] & F[\delta, \phi] & F[\delta, \gamma] & F[\delta, \delta] & F[\delta, \epsilon] \\ F[\epsilon, \alpha] & F[\epsilon, \beta] & F[\epsilon, \phi] & F[\epsilon, \gamma] & F[\epsilon, \delta] & F[\epsilon, \epsilon] \end{bmatrix}$$

Equation 13

Equation 14 below provides an example of permuting the input vector u using the transposed matrix permutation $R_u^t$:

$$u R_u^t = [u[\alpha], u[\beta], u[\phi], u[\gamma], u[\delta], u[\epsilon]] \qquad \text{Equation 14}$$

In embodiments, the encoder 300, operating according to the first scheme, may receive as input the information vector i, the static frozen vector f, and the constraints vector d. The encoder 300 may then determine the six sections of the input vector u: u[α], u[β], u[ϕ], u[γ], u[δ], u[ϵ] individually using an adjusted formula that assures that the constraints are met. The formulas may use matrices which are submatrices of the matrix F and the constraints matrix P. When all six sections of the input vector are set, the encoder may determine the output codeword x such that x=uG.

In embodiments, the submatrices of the matrix F and the constraints matrix P may be parameters of the encoder 300 which may be determined in advance once the indexes sets α, β, ϕ, γ, δ, ϵ are known. In embodiments, these predetermined parameters may include the submatrix F[β, β]$^{-1}$, which may be fully ranked F[β, β] for any selection of the second information index set β. In embodiments, the predetermined parameters may also include the matrices shown in Equations 15 through 19 below:

$$A^{\alpha,\beta}_{(|\alpha|\times|\beta|)} = F[\alpha, \beta]F[\beta, \beta]^{-1} \qquad \text{Equation 15}$$

$$A^{d(\alpha)}_{(|\alpha|\times L)} = P[\alpha, :] + A^{\alpha,\beta}P[\beta, :] \qquad \text{Equation 16}$$

$$A^{d(\beta)}_{(|\beta|\times L)} = F[\beta, \beta]^{-1}P[\beta, :] \qquad \text{Equation 17}$$

$$A^{u(\beta)}_{(|\epsilon|\times|\beta|)} = F[\epsilon, \beta]F[\beta, \beta]^{-1} \qquad \text{Equation 18}$$

$$B^{\epsilon,\delta}_{(L\times L)} = \begin{bmatrix} P[\delta, :] \\ F[\epsilon, \beta]F[\beta, \beta]^{-1}P[\beta, :] + P[\epsilon, :] \end{bmatrix}^{-1} \qquad \text{Equation 19}$$

In embodiments, if the matrix in Equation 19 is not invertible, then there may be no systematic encoder that would embed the information vector in the bit reversal premutation of the information index set.

Figure 4:
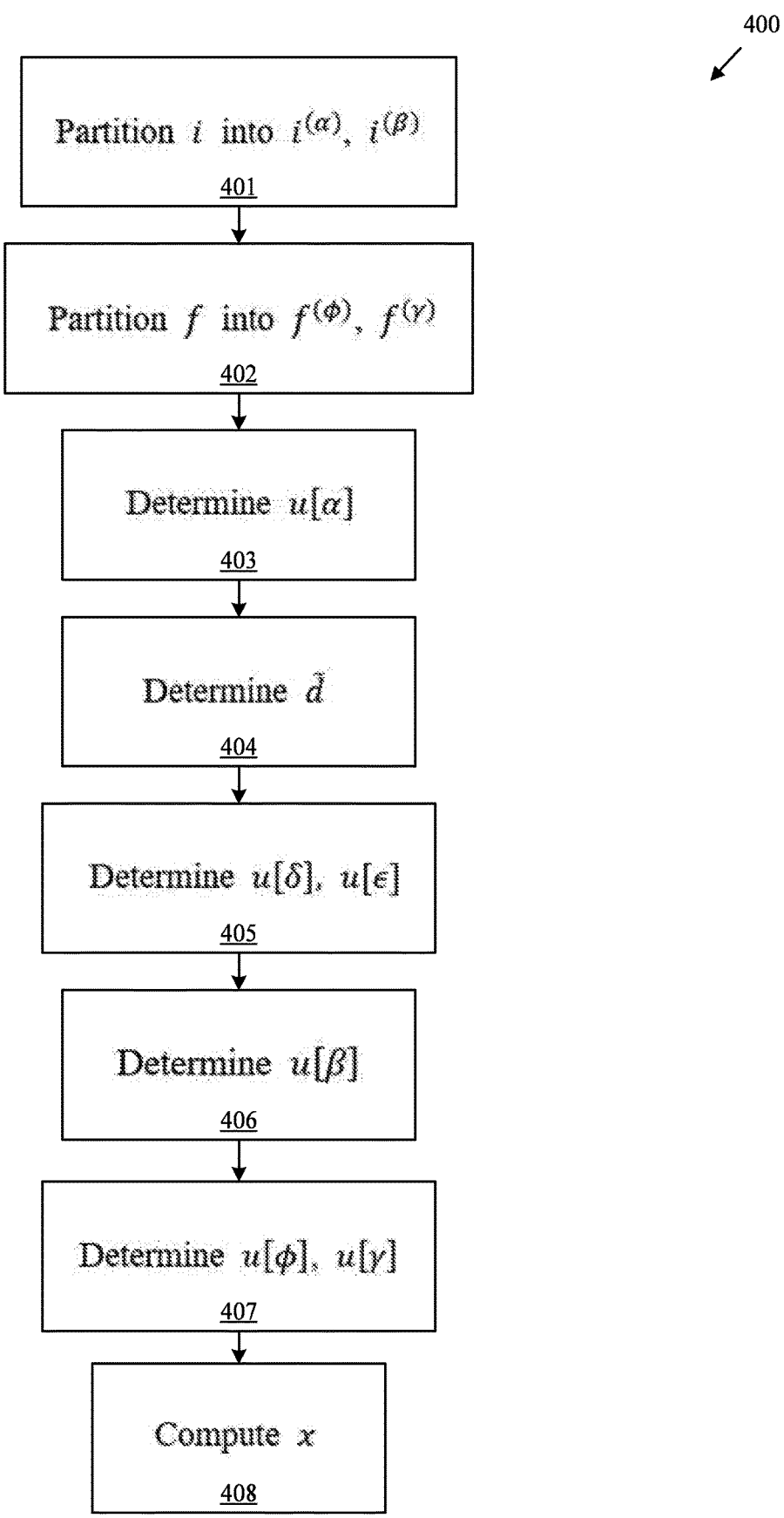
FIG. 4 is a flowchart of a process for generating an output codeword using the encoder of FIG. 3, as discussed above.

FIG. 4 shows an example of a process 400 for generating an output codeword x corresponding to the first scheme, as discussed above. In embodiments, the process 400 may be performed by the encoder 300. The process 400 may receive as input the information vector i, the static frozen vector f, and the constraints vector d. As discussed above, predetermined parameters may be determined for the process 400 in advance, for example the constraints matrix P, the index sets $\alpha$, $\beta$, $\phi$, $\gamma$, $\delta$, and $\epsilon$, the submatrix $F[\beta, \beta]^{-1}$, and the matrices shown in Equations 15 through 19.

As shown in FIG. 4, at operation 401, the process 400 may include partitioning the information vector i according to any arbitrary partition. For example, in embodiments, the information vector i may be partitioned according to Equation 20 below:

$$i^{(\alpha)}=i[0:|\alpha|-1], i^{(\beta)}=i[|\alpha|:k-1] \qquad \text{Equation 20}$$

At operation 402, the process 400 may include partitioning the frozen vector f according to any arbitrary partition. For example, in embodiments, the frozen vector f may be partitioned according to Equation 21 below:

$$f^{(\phi)}=f[0:|\phi|-1], f^{(\gamma)}=f[|\phi|:n-k-L-1] \qquad \text{Equation 21}$$

At operation 403, the process 400 may include determining a first input vector section u[α] according to Equation 22 below:

$$u[\alpha]=i^{(\alpha)}F[\alpha,\alpha] \qquad \text{Equation 22}$$

At operation 404, the process 400 may include determining an updated constraints vector $\tilde{d}$ according to Equation 23 below:

$$\tilde{d}=d+u[\alpha]A^{d(\alpha)}+i^{(\beta)}A^{d(\beta)}+f^{(\phi)}P[\phi,:]+f^{(\gamma)}P[\gamma,:] \qquad \text{Equation 23}$$

At operation 405, the process 400 may include determining a second input vector section u[δ] and a third input vector section u[ε] according to Equation 24 below:

$$[u[\delta],u[\epsilon]]=\tilde{d}B^{\epsilon,\delta} \qquad \text{Equation 24}$$

At operation 406, the process 400 may include determining a fourth input vector section u[β] according to Equation 25 below:

$$u[\beta]=u[\alpha]A^{\alpha,\beta}+(i^{(\beta)}+f^{(\gamma)}F[\gamma,\beta])F[\beta,\beta]^{-1}+u[\epsilon]A^{u(\beta)}$$
Equation 25

At operation 407, the process 400 may include determining a first input vector section u[α] according to Equation 26 and Equation 27 below:

$$u[\phi]=f^{(\phi)} \qquad \text{Equation 26}$$

$$u[\gamma]=f^{(\gamma)} \qquad \text{Equation 27}$$

At operation 408, the process 400 may include determining the output codeword x according to Equation 28 below:

$$x=uG \qquad \text{Equation 28}$$

In embodiments, the process 400 may result in the encoder 300 outputting a polar codeword x, such that $x[BR(\alpha)]=i^{(\alpha)}$, $x[BR(\beta)]=i^{(\beta)}$, $u \cdot P=d$, and $u_{out}[\phi]=f$ for $u_{out}=xG$.

In embodiments, operation 403 may have the highest complexity because it involves a vector of length |α| multiplied by an (|α|×|α|) matrix, and therefore may have a complexity of $O(|\alpha|^2)$. However, multiplying an n length vector by matrix $G_{n \times n}$ may have a complexity of O(n log n). In an example use case, the number of indexes which do not meet the domination condition may small, such that |β|<<k, which may mean that $|\alpha^2|>n \log n$. In embodiments, the matrix F[α, α] is a permutation of a submatrix of G, which means that the vector $i^{(\alpha)}$ could be embedded in an n length vector (in which all other entries are zeros) and multiplied by G, and the relevant subvector could be removed and permuted. This process may have complexity of O(n log n).

A polar subcode encoder that requires domination may have complexity of O(n log n+nL). In embodiments, operation 403 may have a complexity of O(n log n) operation 404 may have a complexity of O(L(k+|φ|)), operation 405 may have a complexity of $O(L^2)$, operation 406 may have a complexity of O(|β|(k+|ε|+[γ])), and operation 408 may have a complexity of O(n log n). Therefore, the complexity of the encoder 300 may be O(nlog n+nL+|β|(k+|ε|+[γ])). In embodiments, the complexity of the encoder 300 may increase with the number of indexes which do not meet the domination condition. In embodiments, if |γ|=0 or |ε|=0, then the process 400 may still be performed by the encoder 300, and becomes simpler.

Figure 5A:
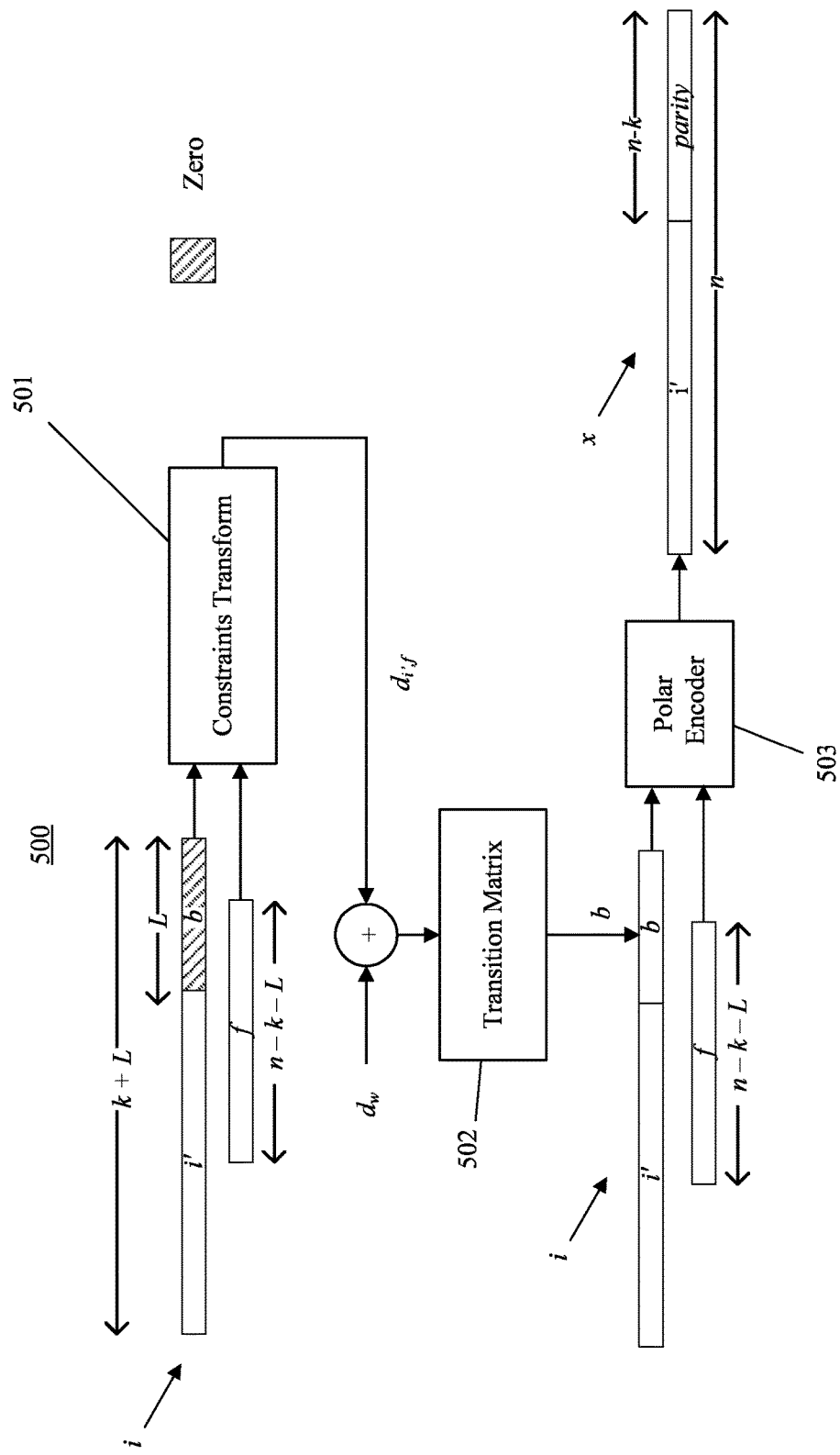
FIG. 5A is a block diagram of an encoder for encoding information bits to generate an output codeword according to a second example scheme, according to embodiments.

FIG. 5A is a block diagram of an encoder 500 for encoding information bits to generate an output codeword according to the second scheme, according to embodiments. In embodiments, the encoder 500 operating according to the second scheme may confiscates L bits, from either the information set (α) or the dynamic frozen set (δ), and convert them to be balance bits b. In embodiments, the balance bits b may be assigned with the task to enforce the additional constraints. In embodiments, L may represent both the length of the constraints vector d, and therefore the number of constraints, and may also represent the length of the balance bits b.

In embodiments, the encoder 500 may correspond to the encoder 104 discussed above. As shown in FIG. 5A, encoder 500 may include a polar encoder 503. The polar encoder 503 may be a simple and systematic polar encoder which may require the polar domination property. Encoder 500 may further include a constraints transform module 501, which may be used to find a translation between the input of the polar encoder 503 and a preliminary constraints vector $d_{i',f}$. Encoder 500 may further include a transition matrix module 502 that may apply a transition matrix which transforms the preliminary constraints vector $d_{i',f}$ to the balance bits b.

Figure 5B:
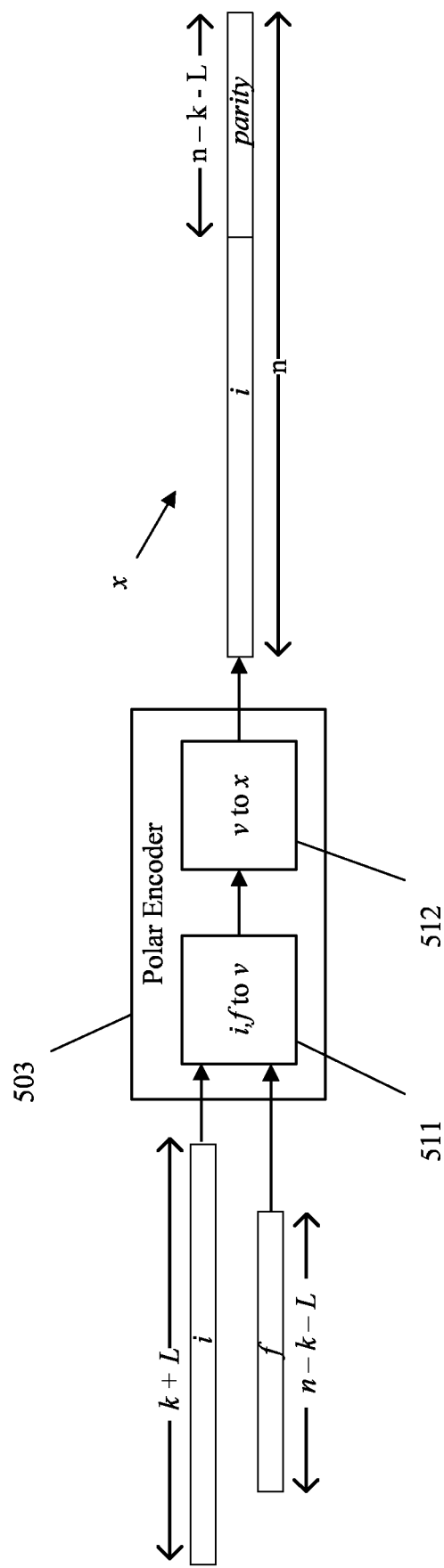
FIG. 5B is a block diagram of a polar encoder, according to embodiments.

FIG. 5B illustrates an example of the polar encoder 503, according to embodiments. As shown in FIG. 5B, the polar encoder 503 may receive the information vector i, which may have length k+L, and the frozen vector f, which may have length n−k−L, as input, and may generate a length n codeword x according to Equation 29 below:

$$x=\text{PolarEnc}(i) \qquad \text{Equation 29}$$

In embodiments, the polar encoder 503 may include an intermediate vector module 511 which may embed the information vector i and the frozen vector f into an n length vector v(i, f) such that v[α]=i, v[φ]=f. In embodiments, the polar encoder 503 may include a codeword generator module 512 which may receive the intermediate vector v and generate a codeword x such that x[BR(α)]=i and xG[:, φ]=v[φ]=f. Using the matrix G, the polar encoder 503 may have a complexity of O(n log n).

As shown in FIG. 5B, the output codeword c may include a parity vector parity, which may be generated by the polar encoder 503 based on the information vector i and the frozen vector f. Although FIG. 5B illustrates bits of the information vector i arranged together at a left side of the codeword x, and illustrates bits of the parity vector parity arranged together at a right side of the codeword x, embodiments are not limited thereto. For example, in embodiments each of the bits may be placed at any position throughout the codeword x.

Figure 5C:
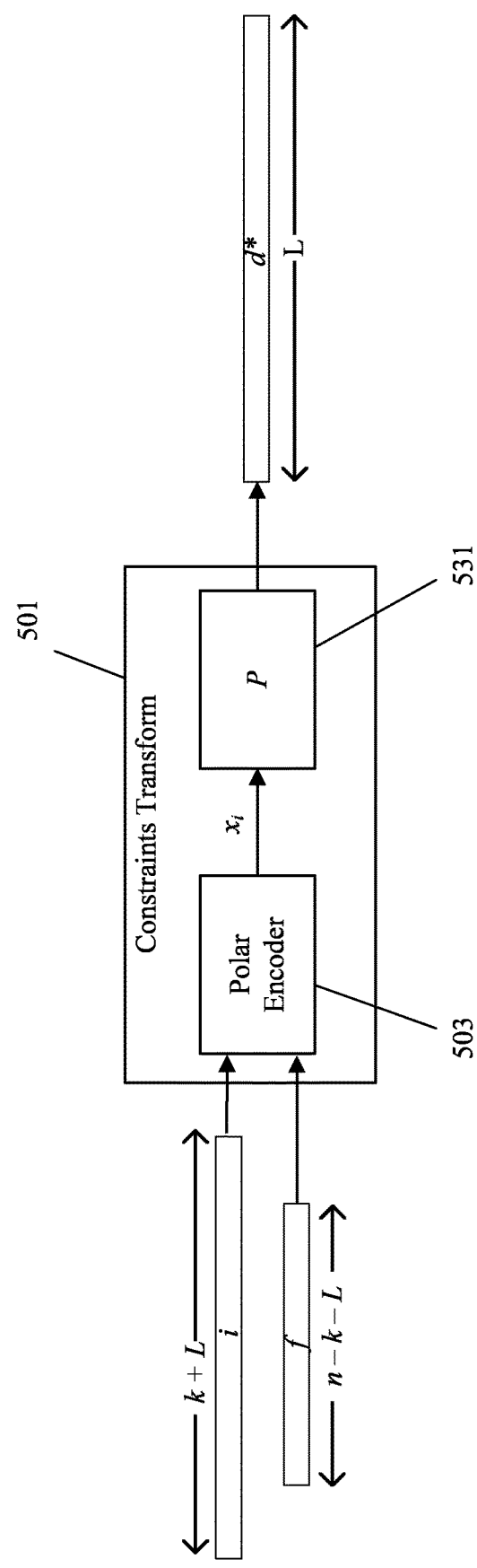
FIG. 5C is a block diagram of a constraints transform module 501, according to embodiments.

FIG. 5C illustrates an example of the constraints transform module 501, according to embodiments. As shown in FIG. 5C, the constraints transform module 501 may receive the information vector i and the frozen vector f as input, and may apply a linear constraints transform in order to output a preliminary constraints vector d', which may have length L. In embodiments, the constraints transform module 501 may include a polar encoder 503, which may encode the information vector i and the frozen vector f to obtain a preliminary codeword $x_i$. Then, the constraints transform module 501 may multiply the preliminary codeword $x_i$ by a constraints matrix P to obtain the preliminary constraints vector d* according to Equation 30 below:

$$d^* = \text{ConstraintsTransform}(i,f) = x(i,f)P = \text{PolarEnc}(v(i,f)) \cdot P \quad \text{Equation 30}$$

In order to enforce the additional constraints corresponding to the polar subcode, the information vector i may be expanded to include an additional L number of bits, which may be the balance bits denoted b. For example, the expanded information vector i used as input for the encoder 500 may have a length k+L, and may include information bits in an information vector i', which may have a length k, and may further include the balance bits b, which may have a length L. In embodiments, the index set for the information bits in the expanded information vector i may be referred to as set $\gamma$, such that $i[\gamma]=i'$, and the index set for the balance bits in the expanded information vector i may be referred to as set $\lambda$, such that $i[\lambda]=b$, and $|\alpha \cap \beta|=0$. Set $\lambda$ locations in the indexes of i may be tailored to the specific problem, for example to the specific codes being used, and are not necessarily consecutive.

As discussed above, a polar subcode encoder may have three index sets for the input vector u ($\alpha$, $\phi$ and $\delta$). However, the dynamic frozen set $\delta$ does not exist in the polar code context, and therefore the polar encoder 503 may not be aware of it. This problem may be solved by merging the dynamic frozen set $\delta$ into the information set of the of the input to the polar encoder 503, and denoting the index sets of the polar encoder 503 with a superscript $^{(v)}$, such that $\alpha^{(v)} = \alpha \cup \delta$, $|\alpha^{(v)}| = k+L$, $|\phi^{(v)}| = n-k-L$. Accordingly, the domination property may be expressed as $j \in \alpha^{(v)}$ & $i \succeq j \Rightarrow i \in \alpha^{(v)}$.

Figure 6:
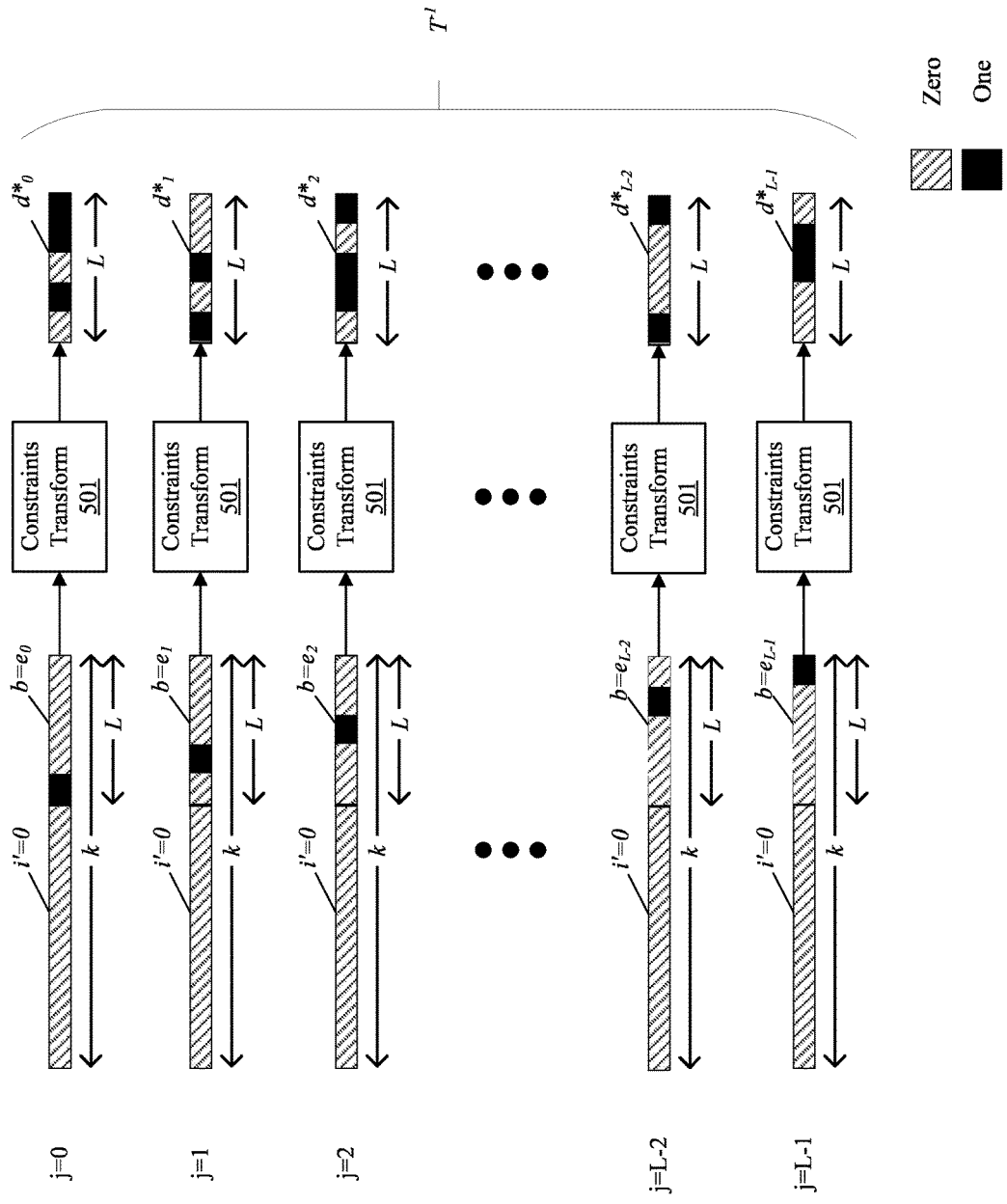
FIG. 6 illustrates an example of a process for constructing a transition matrix, according to embodiments.
Figure 7:
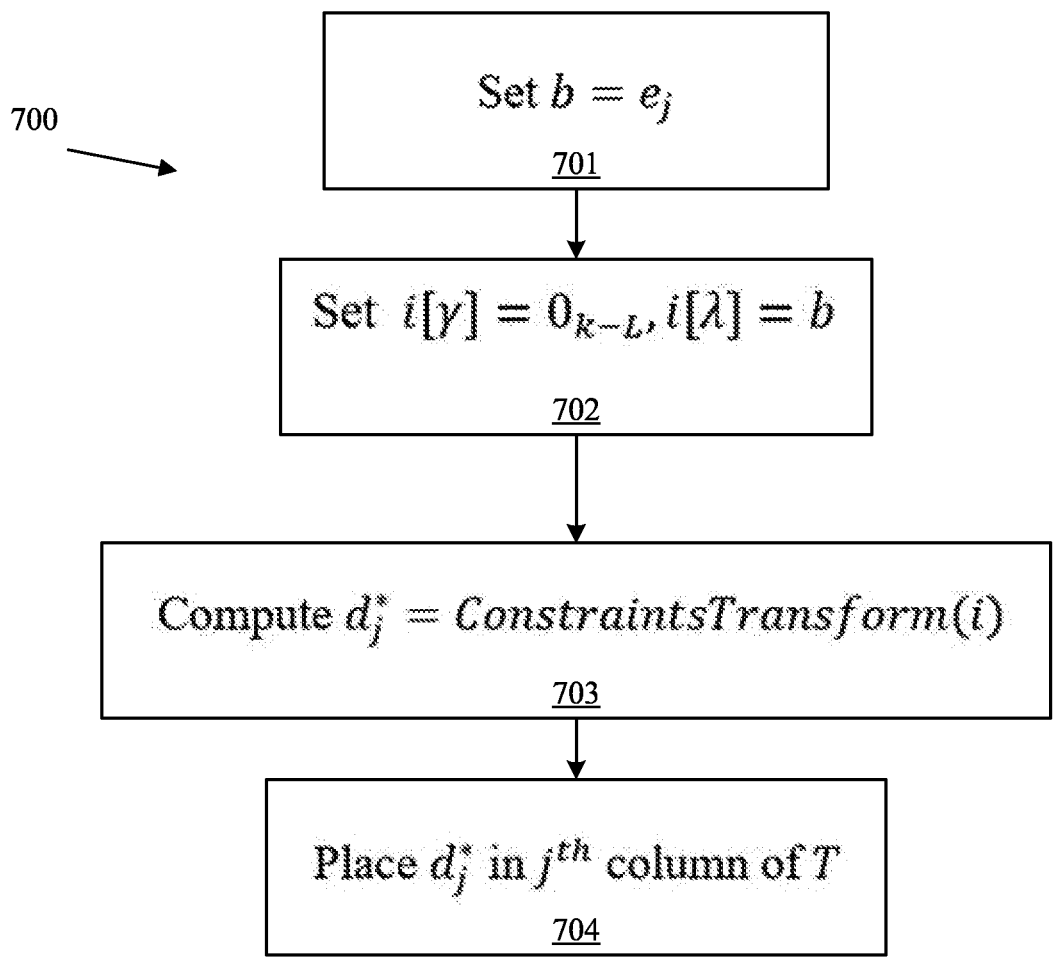
FIG. 7 is a flowchart of a process for constructing a transition matrix corresponding to FIG. 6, according to embodiments.

In embodiments, the balance bits b may be used to make the output codeword x meet the demanded constraints, for example the constraints required by the polar subcode. In order to determine the relationship between the balance bits b and the preliminary constraints vector d*, a transition matrix T may be assembled. In embodiments, the standard basis may be expressed as $\{e_0, e_1, \ldots, e_{L-1}\}$, in which the $k^{th}$ component of a basis vector $e_k$ is equal to 1, and all other components of the basis vector $e_k$ are equal to 0 (e.g., $e_{k,k}=1$ and $e_{k,j \neq k}=0$). The transition matrix T may be used to transform the standard basis to a basis that that triggers the correct response from the encoder 500 using the activated balance bits b. FIG. 6 illustrates an example of a process for constructing a transition matrix T, according to embodiments. FIG. 7 is a flowchart of a process 700 for constructing a transition matrix T corresponding to FIG. 6, according to embodiments. As shown in FIG. 6, for each j from j=0 through j=L-1, a different expanded information vector i is input into the constraints transform module 501 to obtain a constraints vector $d_j^*$, and then the constraints vectors $d_j^*$ are assembled into the a transition matrix T.

For example, at operation 701, the process 700 may include setting the balance bits b equal to the basis vector $e_j$. At operation 702, the process 700 may include placing the balance bits b in the input vector i, and setting the information vector i' of the expanded information vector i to 0. At operation 703, the process 700 may include computing the constraints vector $d_j^*$ using the constraints transform module 501. Then, at operation 704, the process 700 may include placing the constraints vector in the $j^{th}$ column of transition matrix T, which may be the $j^{th}$ row of an inverse transition matrix $T^{-1}$. As illustrated in FIG. 6, the balance bits b may be grouped and aligned on a right side of the expanded input vector i, but embodiments are not limited thereto. For example, in embodiments the balance bits b may be interleaved anywhere in the expanded input vector i.

In embodiments, the transition matrix T may be used to manufacture any L length vector with the balance bits b. For this to happen, the transition matrix T must be fully ranked. If the transition matrix T is not fully ranked, the index set $\lambda$ may be changed. A b to d* transform is linear, and may be represented according to Equation 31 below:

$$d^* = Tb \quad \text{Equation 31}$$

The transition matrix T computed according to FIGS. 6 and 7 may be invertible. As a result, for any constraints vector d, the balance bits b which produce the constraints vector $\tilde{d}$ can be found according to Equation 32 below:

$$\tilde{b} = T^{-1}\tilde{d} \quad \text{Equation 32}$$

In embodiments, the encoder 500 may receive as inputs the information vector i' of length k, the frozen vector f of length n-k-L, and a target constraints vector $d_w$. Predetermined parameters for the encoder 500 may be determined in advance. For example, in embodiments the predetermined parameters may include, for example, the constraints matrix P such that $d_w = P \cdot x$ for every output codeword x that meets the requirements of the polar subcode. In addition, the predetermined parameters may include the inverse transition matrix, $T^{-1}$ and the index sets $\alpha$, $\phi$, $\gamma$, $\lambda$.

In embodiments, the encoder 500 may compute the preliminary constraints vector $d_{i',f}$ which may represent the impact of the information vector i' on the constraints vector d. In embodiments, the preliminary constraints vector $d_{i',f}$ may be output by the constraints transform module 501, where $i[\gamma]=i'$ and $i[\lambda]=0$. As discussed above, the constraints transform module 501 may obtain the preliminary constraints vector $d_{i',f}$ by applying the constraints matrix P to the preliminary codeword $x_i$, which may be output by the polar encoder 503. However, because the preliminary codeword $x_i$ is not known to satisfy the requirements of the polar subcode. Therefore, the target constraints vector $d_w$ may be used to produce balance bits b which may be added to the expanded input vector i to cause the polar encoder 503 to produce an output codeword x which satisfies the polar subcode requirements. In embodiments, the balance bits b may be determined by the transition matrix module 502 according to Equation 33 below:

$$b = T^{-1}(d_{i',f} + d_w) \quad \text{(Equation 33)}$$

Then, the polar encoder 503 may be activated for the second time with the computed balance bits b added to the information vector i such that $i[\lambda]=b$.

Because the operations performed by the encoder 500 may be linear operations, the encoder 500 may be implemented using different schemes which are equivalent to each other. For example, according to a first example scheme, the encoder 500 may use the second activation of the polar encoder 503 to produce the output codeword x by injecting the expanded input vector i with $i[\gamma]=i'$ and $i[\lambda]=b$.

Figure 8:
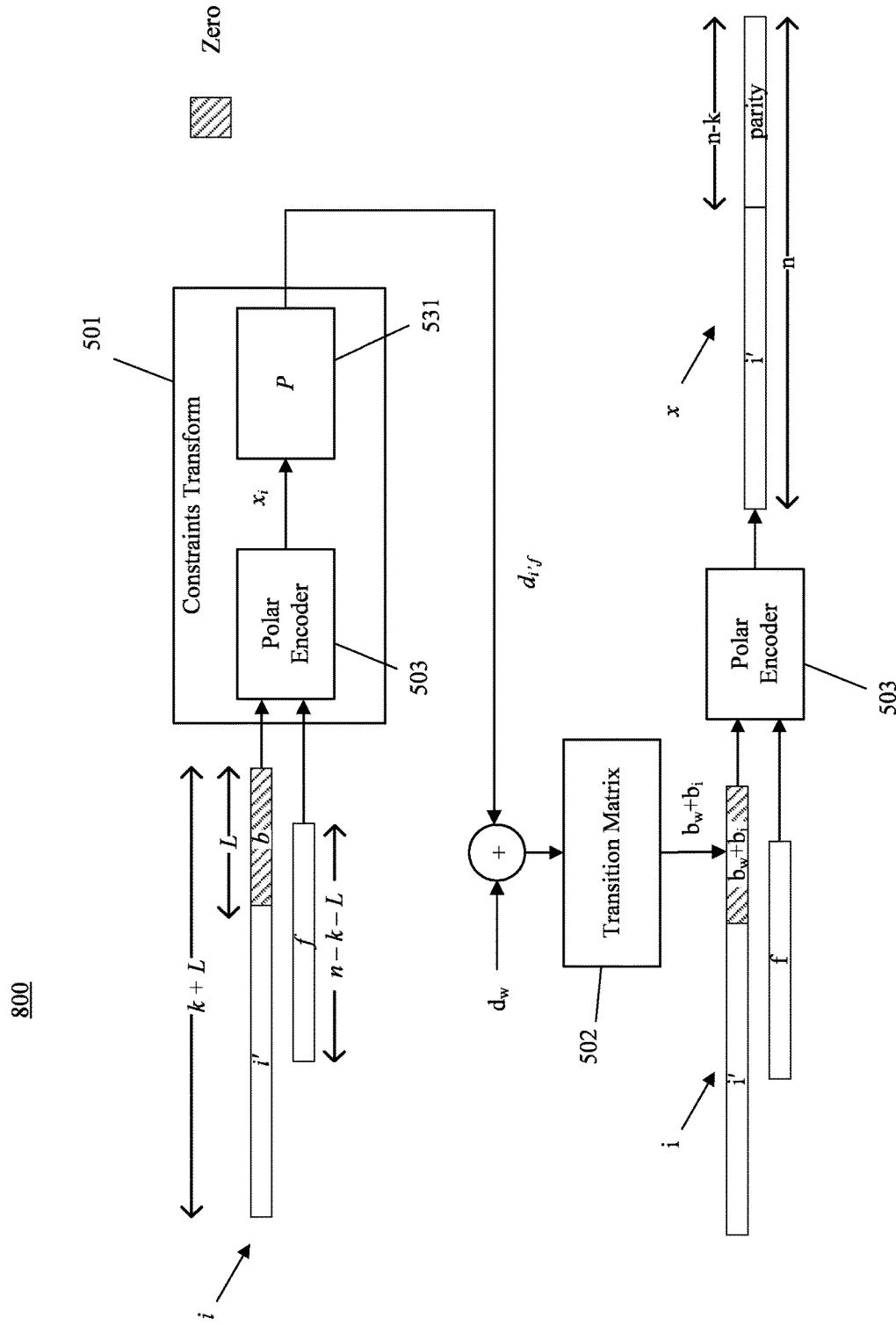
FIG. 8 is a block diagram of an encoder for encoding information bits to generate an output codeword according to a second scheme, according to embodiments.

FIG. 8 is a block diagram of an example of an encoder 800 for encoding information bits to generate an output codeword according to the second scheme, according to embodiments. In embodiments, the encoder 800 may correspond to the encoder 500, and may include a constraints transform module 501, a transition matrix module 502, a polar encoder 503, and a constraints matrix module 504.

Figure 9:
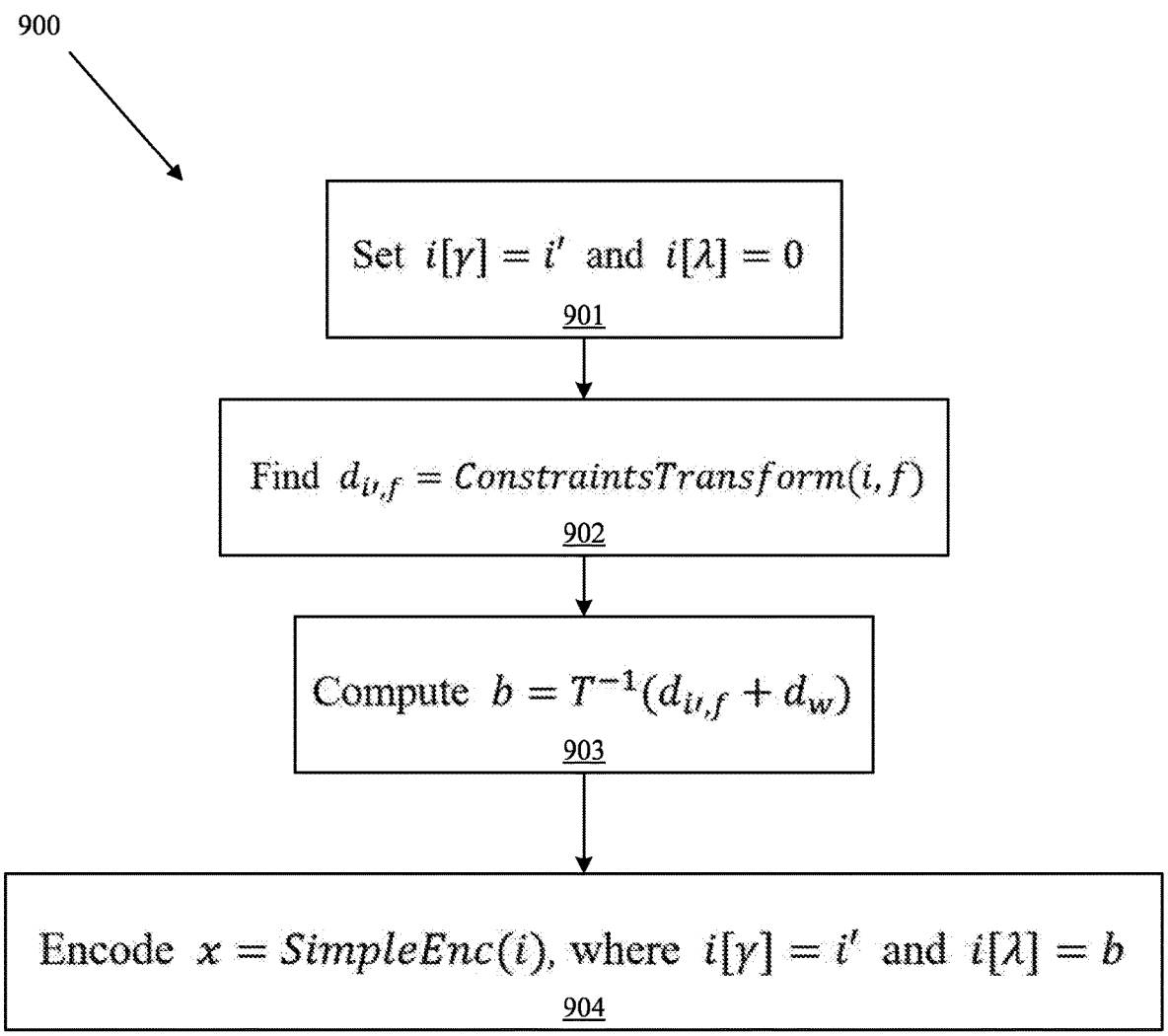
FIG. 9 is a flowchart of a process for generating an output codeword using the encoder of FIG. 9, according to embodiments.

FIG. 9 is a flowchart of a process 900 for generating an output codeword using the encoder 800, according to embodiments. Referring to FIGS. 8 and 9, at operation 901, the process 900 may include placing the information vector i' into the input vector i, and setting the balance bits b to zero. At operation 902, the process 900 may include computing the preliminary constraints vector $d_{i',f}$ using the constraints transform module 501. At operation 903, the process 900 may include computing the balance bits b based on the preliminary constraints vector $d_{i',f}$ and the target constraints vector $d_w$ using the transition matrix module 502. At operation 904, the process 900 may include updating the expanded input vector i to include the balance bits b along with the information vector i', and using the polar encoder 503 to encode the updated expanded input vector i to generate the output codeword x.

Figure 10A:
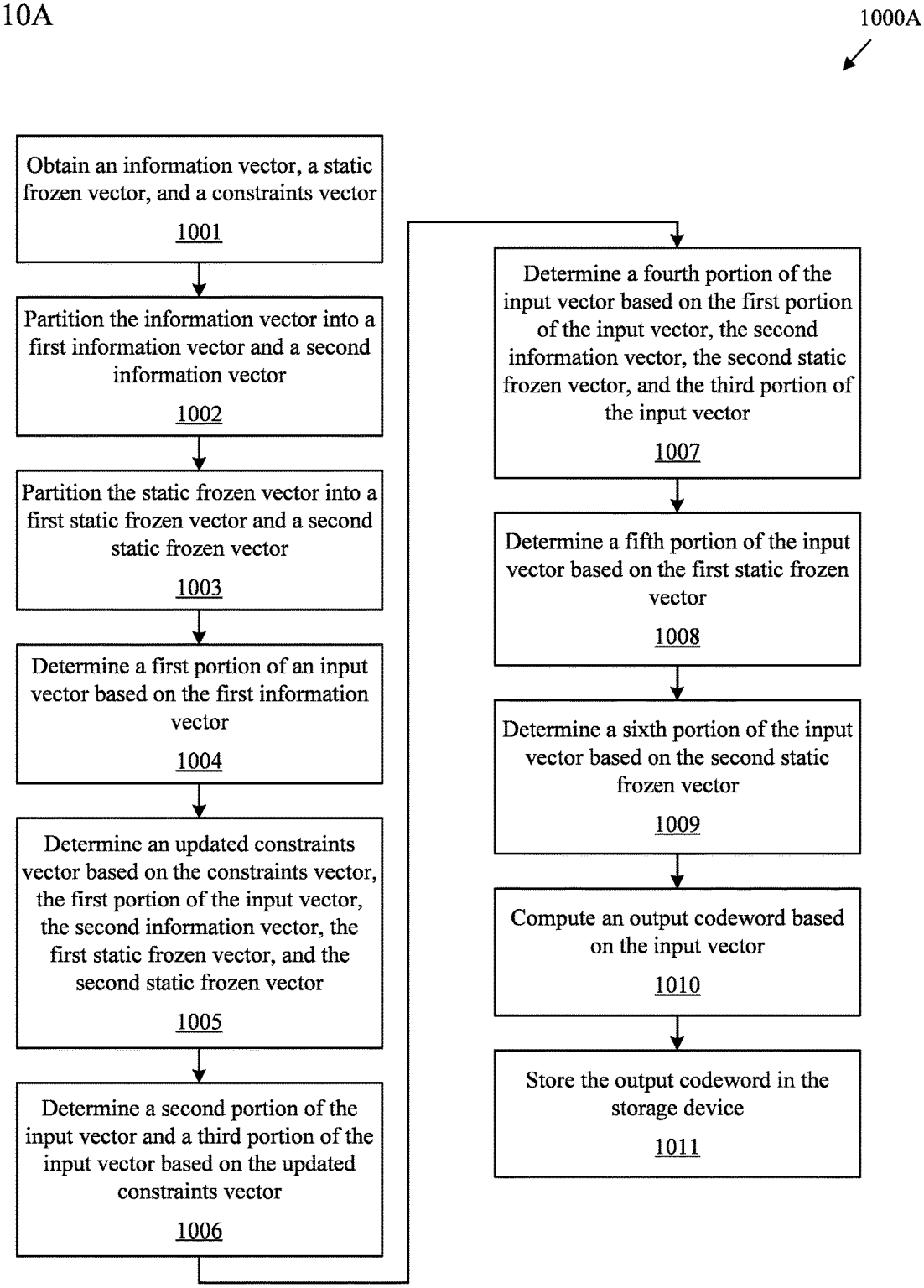
FIGS. 10A and 10B are flowcharts of example processes for controlling a storage system, according to embodiments.

FIG. 10A is a block diagram of an example of a process 1000A for controlling a storage system, according to embodiments. In some implementations, one or more process blocks of FIG. 10A may be performed by memory system 1000, or any other element described herein, for example memory controller 100, or encoder 104, encoder 300, or any element included therein.

As shown in FIG. 10A, at operation 1001 the process 1001 may include obtaining an information vector including a plurality of information bits, a static frozen vector including a plurality of static frozen bits, and a constraints vector which indicates at least one constraint. In embodiments, the information bits may correspond to bits of the information vector i', the frozen vector may correspond to the static frozen vector f, and the constraints vector may correspond to the constraints vector d.

As further shown in FIG. 10A, at operation 1002 the process 1000A may include partitioning the information vector into a first information vector and a second information vector. In embodiments, the first information vector may correspond to the first information vector $i^{(\alpha)}$, and the second information vector may correspond to the second information vector $i^{(\beta)}$.

As further shown in FIG. 10A, at operation 1003 the process 1000A may include partitioning the static frozen vector into a first static frozen vector and a second static frozen vector. In embodiments, the first static frozen vector may correspond to the first static frozen vector $f^{(\phi)}$, and the second static frozen vector may correspond to the second static frozen vector $f^{(\gamma)}$.

As further shown in FIG. 10A, at operation 1004 the process 1000A may include determining a first portion of an input vector based on the first information vector. In embodiments, the first portion of the input vector may correspond to the first input vector section $u[\alpha]$.

As further shown in FIG. 10A, at operation 1005 the process 1000A may include determining an updated constraints vector based on the constraints vector, the first portion of the input vector, the second information vector, the first static frozen vector, and the second static frozen vector. In embodiments, the updated constraints vector may correspond to the updated constraints vector $\bar{d}$.

As further shown in FIG. 10A, at operation 1006 the process 1000A may include determining a second portion of the input vector and a third portion of the input vector based on the updated constraints vector. In embodiments, the second portion of the input vector may correspond to the second input vector section $u[\delta]$ and the third portion of the input vector may correspond to the third input vector section $u[\epsilon]$.

As further shown in FIG. 10A, at operation 1007 the process 1000A may include determining a fourth portion of the input vector based on the first portion of the input vector, the second information vector, the second static frozen vector, and the third portion of the input vector. In embodiments, the fourth portion of the input vector may correspond to the fourth input vector section $u[\beta]$.

As further shown in FIG. 10A, at operation 1008 the process 1000A may include determining a fifth portion of the input vector based on the first static frozen vector. In embodiments, the fifth portion of the input vector may correspond to the fifth input vector section $u[\phi]$.

As further shown in FIG. 10A, at operation 1009 the process 1000A may include determining a sixth portion of the input vector based on the second static frozen vector. In embodiments, the sixth portion of the input vector may correspond to the sixth input vector section $u[\gamma]$.

As further shown in FIG. 10A, at operation 1010 the process 1000A may include computing an output codeword based on the input vector. In embodiments, the output codeword may correspond to the codeword x.

As further shown in FIG. 10A, at operation 1011 the process 1000A may include storing the output codeword in a storage device. In embodiments, the storage device may correspond to the memory device 110.

Figure 10B:
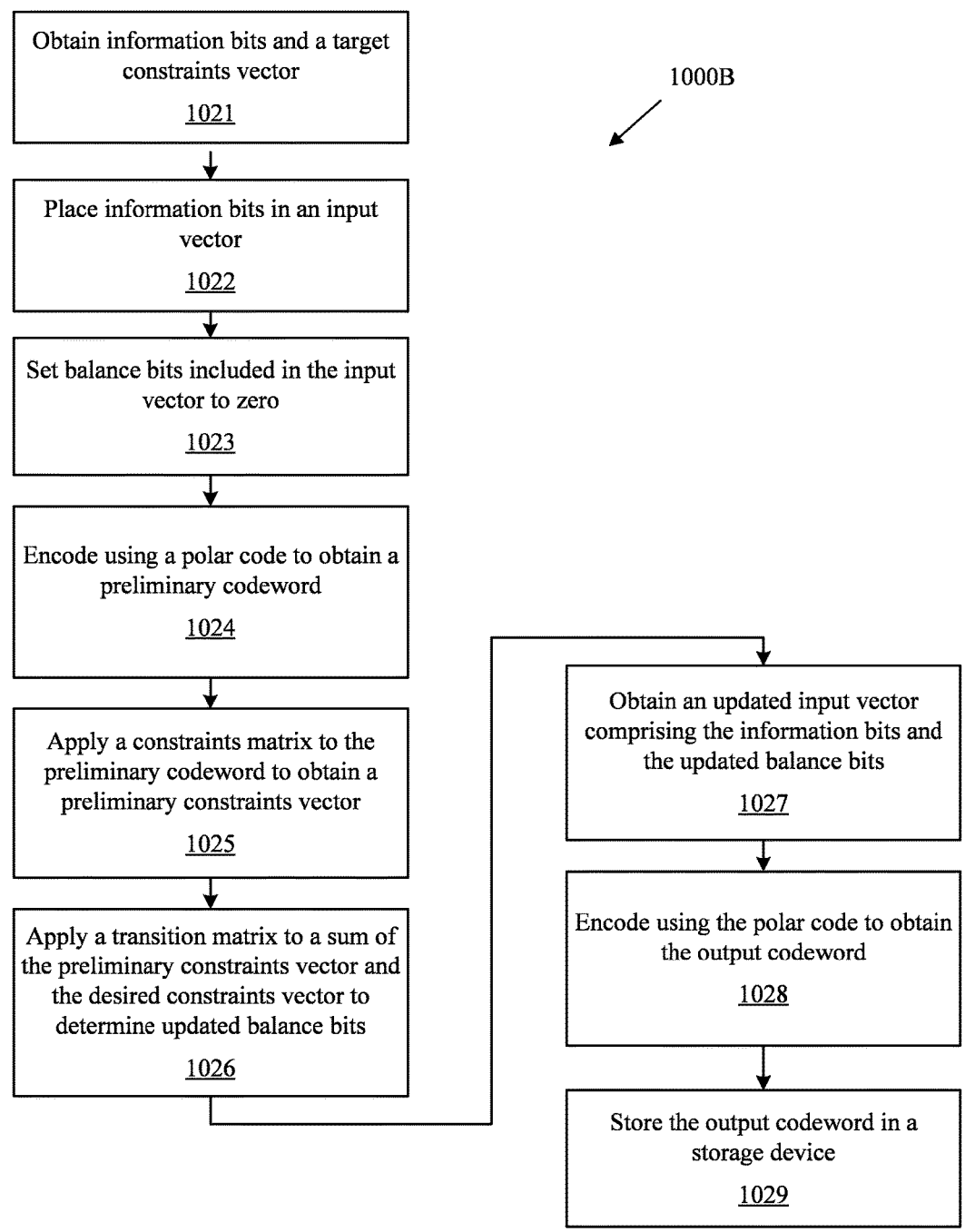

FIG. 10B is a block diagram of an example of a process 1000B for controlling a storage system, according to embodiments. In some implementations, one or more process blocks of FIG. 10B may be performed by memory system 1000, or any other element described herein, for example memory controller 100, or encoder 104, encoder 800, or any element included therein.

As shown in FIG. 10B, at operation 1021 the process 1000B may include obtaining information bits, a frozen vector, and a target constraints vector. In embodiments, the information bits may correspond to bits of the information vector i', and the target constraints vector may correspond to the target constraints vector $d_w$.

As further shown in FIG. 10B, at operation 1022 the process 1000B may include placing the information bits in an input vector. In embodiments, the input vector may correspond to the expanded information vector i.

As further shown in FIG. 10B, at operation 1023 the process 1000B may include setting balance bits included in the input vector to zero. In embodiments, the balance bits may correspond to the balance bits b.

As further shown in FIG. 10B, at operation 1024 the process 1000B may include encoding the input vector and the frozen vector using a polar code to obtain a preliminary codeword. In embodiments, the preliminary codeword may correspond to the preliminary codeword $x_i$.

As further shown in FIG. 10B, at operation 1025 the process 1000B may include applying a constraints matrix to the preliminary codeword to obtain a preliminary constraints vector. In embodiments, the constraints matrix may correspond to the constraints matrix P.

As further shown in FIG. 10B, at operation 1026 the process 1000B may include applying a transition matrix to a sum of the preliminary constraints vector and the target constraints vector to determine updated balance bits. In embodiments, the transition matrix may correspond to at least one of the transition matrix T and the inverse transition matrix $T^{-1}$.

As further shown in FIG. 10B, at operation 1027 the process 1000B may include obtaining an updated input vector including the information bits and the updated balance bits.

As further shown in FIG. 10B, at operation 1028 the process 1000B may include encoding the updated input vector and the frozen vector using the polar code to obtain an output codeword. In embodiments, the output codeword may correspond to the output codeword x.

As further shown in FIG. 10B, at operation 1029 the process 1000B may include storing the output codeword in a storage device. In embodiments, the storage device may correspond to the memory device 110.

Although FIGS. 10A-10B show example blocks of the processes 1000A-1000B, in some implementations, the processes 1000A-1000B may include additional blocks, fewer blocks, different blocks, or differently arranged blocks than those depicted in FIGS. 10A-10B. Additionally, or alternatively, two or more of the blocks of the processes 1000A-1000B may be arranged or combined in any order, or performed in parallel.

Figure 11:
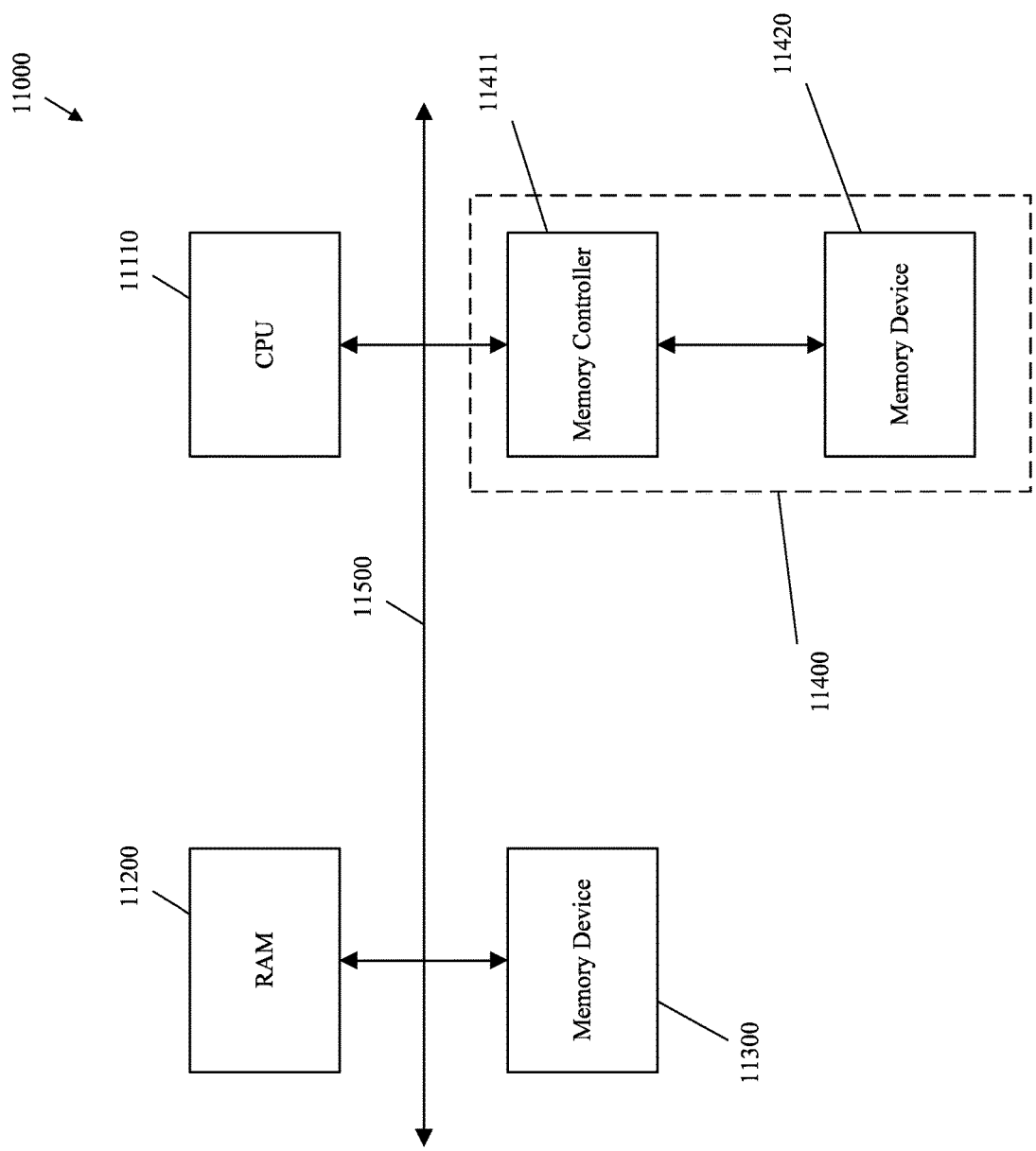
FIG. 11 is a block diagram of computer system including a memory system according to embodiments.

FIG. 11 is a block diagram of a computer system 11000 including a memory system according to embodiments. The computer system 11000, such as a mobile device, a desktop computer, and a server, may employ a memory system 11400 according to embodiments.

The computer system 11000 may include a central processing unit 11100, a RAM 11200, a user interface 11300, and the memory system 11400, are electrically connected to buses 11500. The host as described above may include the central processing unit 11100, the RAM 11200, and the user interface 11300 in the computer system 11000. The central processing unit 11100 may control the entire computer system 11000 and may perform calculations corresponding to user commands input via the user interface 11300. The RAM 11200 may function as a data memory for the central processing unit 11100, and the central processing unit 11100 may write/read data to/from the memory system 11400.

As in example embodiments described above, the memory system 11400 may include a memory controller 11410 and a memory device 11420. The memory controller 11410 may include an encoder and a decoder, and the memory device 11420 may include a cell array including a plurality of memory cells.

According to embodiments, the memory controller 11410 may be implemented by the memory controller 100 discussed above with reference to FIG. 1, and the memory device 11420 may be implemented by the memory device 110 discussed above with reference to FIG. 1.

Figure 12:
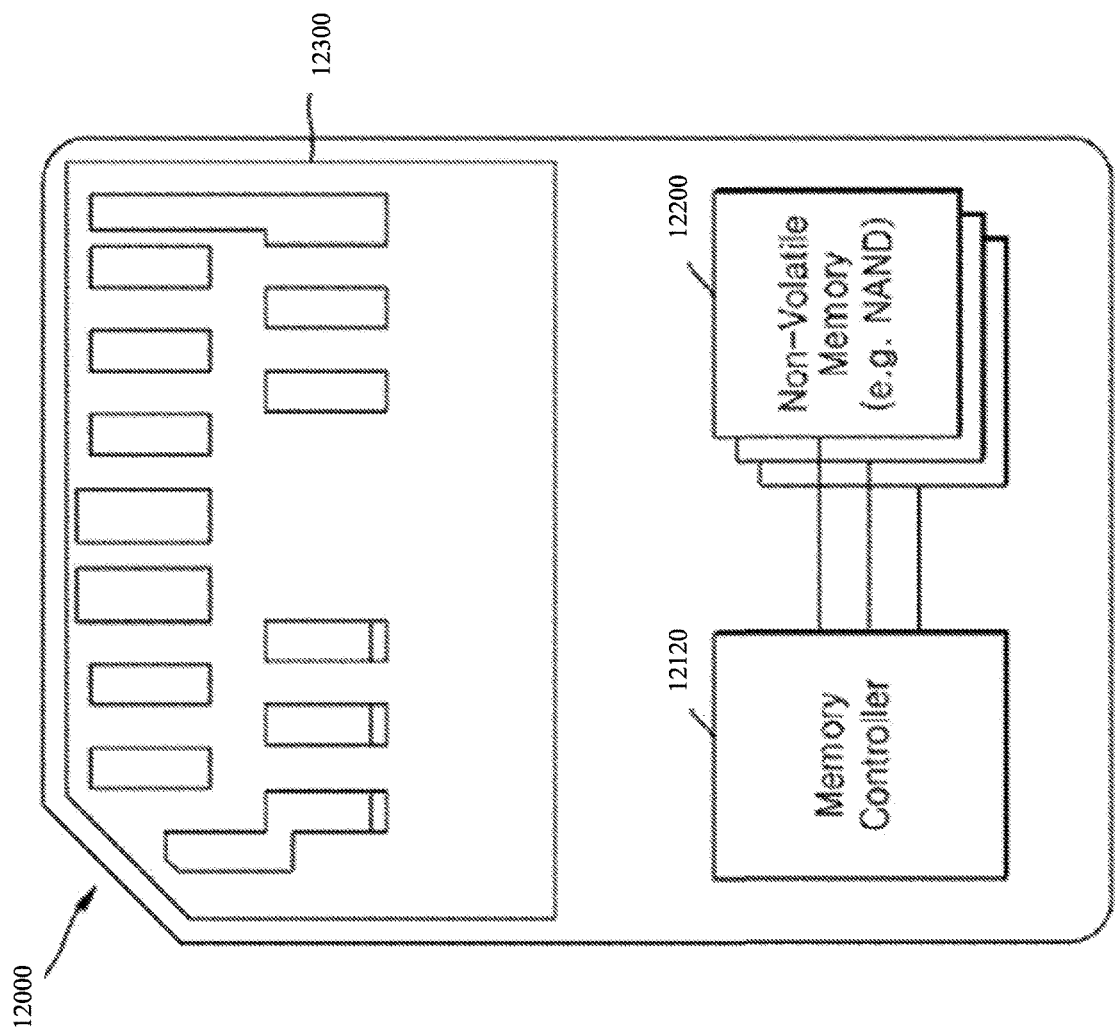
FIG. 12 is a block diagram of a memory card according to embodiments.

FIG. 12 is a block diagram showing a memory card 12000 according to embodiments. The memory system 1000 according to example embodiments discussed above with reference to FIG. 1 may be the memory card 12000. For example, the memory card 12000 may include an embedded multimedia card (eMMC), a secure digital (SD) card, or a Universal Flash Storage (UFS) card. As shown in FIG. 12, the memory card 12000 may include a memory controller 12100, a non-volatile memory 12200, and a port region 12300. The memory controller 12100 may be implemented by the memory controller 100 discussed above with reference to FIG. 1, and the non-volatile memory 12200 shown in FIG. 12 may be implemented by the memory device 110 discussed above with reference to FIG. 1.

The memory controller 12100 may include an encoder and a decoder. The encoder and the decoder may perform an encoding method and a decoding method according to embodiments. The memory controller 12100 may communicate with an external host via the port region 12300 in compliance with a pre-set protocol. The protocol may be eMMC protocol, SD protocol, SATA protocol, SAS protocol, USB protocol, UFS protocol, nonvolatile memory express (NVMe) protocol, peripheral component interconnect express (PCIe) protocol, or compute express link (CXL) protocol. The non-volatile memory 12200 may include memory cells which retain data stored therein even if power supplied thereto is blocked. For example, the non-volatile memory 12200 may include a flash memory, a magnetic random access memory (MRAM), a resistance RAM (RRAM), a ferroelectric RAM (FRAM), or a phase change memory (PCM).

According to embodiments, memory controller 12100 and non-volatile memory 12200 may be implemented, respectively, by the memory controller 100 and the memory device 110 discussed above with reference to FIG. 1.

Figure 13:
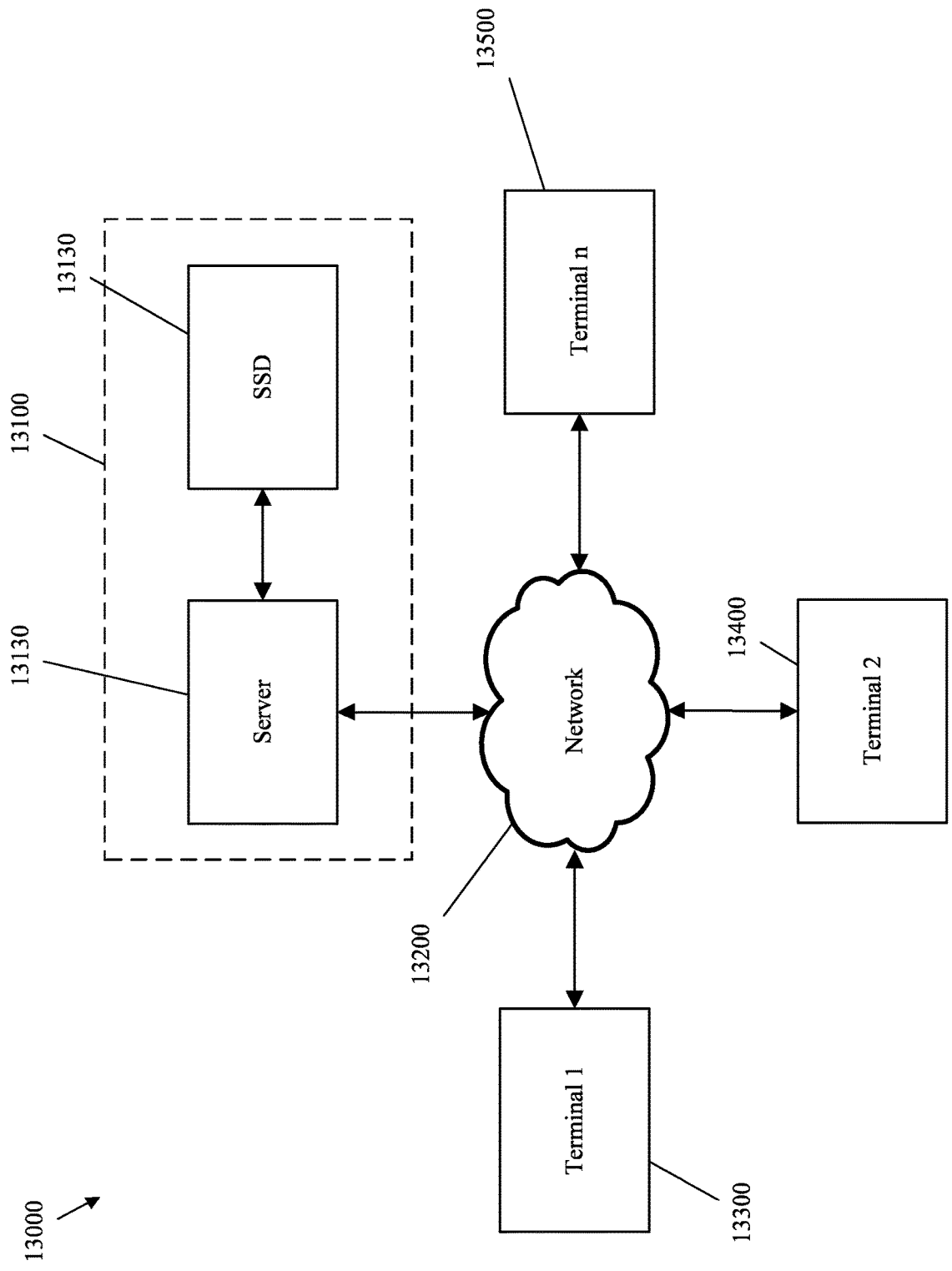
FIG. 13 is a block diagram of a network system including a memory system according to embodiments.

FIG. 13 is a block diagram of a network system 13000 including a memory system according to embodiments. As shown in FIG. 13, the network system 13000 may include a server system 13100 and a plurality of terminals 13300, 13400, and 13500 that are connected via a network 13200. The server system 13100 may include a server 13110 for processing requests received from the plurality of terminals 13300, 13400, and 13500 connected to the network 13200 and an SSD 13120 for storing data corresponding to the requests received from the terminals 13300, 13400, and 13500. Here, the SSD 13120 may be a memory system according to embodiments. For example, in embodiments the SSD 13120 may be implemented by the memory system 1000 discussed above with reference to FIG. 1.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computerreadable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the example embodiments and is not to be construed as limiting thereof. Although a few example embodiments have been described, those skilled in the art will readily appreciate that many modifications are possible in the embodiments without materially departing from the present scope.

What is claimed is:

1. A storage system, comprising:
   a storage device configured to store a plurality of codewords;
   at least one processor configured to:
   obtain an information vector comprising a plurality of information bits, a static frozen vector comprising a plurality of static frozen bits, and a constraints vector which indicates at least one constraint;
   partition the information vector into a first information vector and a second information vector;
   partition the static frozen vector into a first static frozen vector and a second static frozen vector;
   determine a first portion of an input vector based on the first information vector;
   determine an updated constraints vector based on the constraints vector, the first portion of the input vector, the second information vector, the first static frozen vector, and the second static frozen vector;
   determine a second portion of the input vector and a third portion of the input vector based on the updated constraints vector;
   determine a fourth portion of the input vector based on the first portion of the input vector, the second information vector, the second static frozen vector, and the third portion of the input vector;
   determine a fifth portion of the input vector based on the first static frozen vector;
   determine a sixth portion of the input vector based on the second static frozen vector;
   compute an output codeword based on the input vector; and
   store the output codeword in the storage device.

2. The storage system of claim 1, wherein information bits included in the first information vector are included in the output codeword at positions which are bit-reversed with respect to the first information vector, and
   wherein information bits included in the second information vector are included in the output codeword at positions which are bit-reversed with respect to the second information vector.

3. The storage system of claim 1, wherein the output codeword is a Polar codeword which satisfies:

$uP = d$, where u represents the input vector, P represents a constraints matrix, and d represents the constraints vector.

4. The storage system of claim 3, wherein the first portion of the input vector is determined as follows:

$u[\alpha] = i^{(\alpha)} F[\alpha, \alpha]$, wherein $\alpha$ represents a first information index set which indicates information vector indexes which are not dominated by static frozen vector indexes, $u[\alpha]$ represents the first portion of the input vector, $i^{(\alpha)}$ represents the first information vector, F represents a polar generator kernel, and $F[\alpha, \alpha]$ represents a first submatrix of the polar generator kernel which includes rows of the polar generator kernel having the first information index set and columns of the polar generator kernel having the first information index set.

5. The storage system of claim 4, wherein the updated constraints vector is determined as follows:

$$\tilde{d} = d + u[\alpha]A^{d(\alpha)} + i^{(\beta)}A^{d(\beta)} + f^{(\phi)}P[\phi, :] + f^{(\gamma)}P[\gamma, :],$$

$$A^{d(\alpha)}_{(|\alpha| \times L)} = P[\alpha, :] + A^{\alpha,\beta}P[\beta, :],$$

$$A^{\alpha,\beta}_{(|\alpha| \times |\beta|)} = F[\alpha, \beta]F[\beta, \beta]^{-1},$$

$$A^{d(\beta)}_{(|\beta| \times L)} = F[\beta, \beta]^{-1}P[\beta, :]$$

wherein $\beta$ represents a second information index set which indicates information vector indexes which are dominated by the static frozen vector indexes, $\phi$ represents a first frozen index set which indicates static frozen vector indexes which do not dominate the information vector indexes, and $\gamma$ represents a second frozen index set which indicates static frozen vector indexes which dominate the information vector indexes, wherein $\tilde{d}$ represents the updated constraints vector, $i^{(\beta)}$ represents the second information vector, $f^{(\phi)}$ represents the first static frozen vector, and $f^{(\gamma)}$ represents the second static frozen vector, wherein $P[\phi, :]$ represents a first submatrix of the constraints matrix which includes rows of the constraints matrix having the first frozen index set, $P[\gamma, :]$ represents a second submatrix of the constraints matrix which includes rows of the constraints matrix having the second frozen index set, $P[\alpha, :]$ represents a third submatrix of the constraints matrix which includes rows of the constraints matrix having the first information index set, and $P[\beta, :]$ represents a fourth submatrix of the constraints matrix which includes rows of the constraints matrix having the second information index set, and wherein $F[\alpha, \beta]$ represents a second submatrix of the polar generator kernel which includes rows of the polar generator kernel having the first information index set and columns of the polar generator kernel having the second information index set, and $F[\beta, \beta]^{-1}$ represents an inverse of a third submatrix of the polar generator kernel which includes rows of the polar generator kernel having the second information index set and columns of the polar generator kernel having the second information index set.

6. The storage system of claim 5, wherein the at least one processor is further configured to obtain a dynamic frozen vector comprising a portion of the plurality of information bits which are removed from the information vector based on the at least one constraint, and
   wherein the second portion of the input vector and the third portion of the input vector are determined as follows:

$$[u[\delta], u[\epsilon]] = \tilde{d}B^{\epsilon,\delta},$$

$$B^{\epsilon,\delta}_{(L \times L)} = \begin{bmatrix} P[\delta, :] \\ F[\epsilon, \beta]F[\beta, \beta]^{-1}P[\beta, :] + P[\epsilon, :] \end{bmatrix}^{-1},$$

wherein δ represents a first set of dynamic frozen vector indexes which do not dominate the information vector indexes, ε represents a second set of dynamic frozen vector indexes which dominate the information vector indexes, wherein u[δ] represents the second portion of the input vector, and u[ε] represents the second portion of the input vector, wherein P[δ, :] represents a fifth submatrix of the constraints matrix which includes rows of the constraints matrix having the first set of dynamic frozen vector indexes, P[ε, :] represents a sixth submatrix of the constraints matrix which includes rows of the constraints matrix having the second set of dynamic frozen vector indexes, and wherein F[ε, β] represents a fourth submatrix of the polar generator kernel which includes rows of the polar generator kernel having the second set of dynamic frozen vector indexes and columns of the polar generator kernel having the second information index set.

7. The storage system of claim 6, wherein the fourth portion of the input vector is determined as follows:

$$u[\beta] = u[\alpha]A^{\alpha,\beta} + (i^{(\beta)} + f^{(\gamma)}F[\gamma, \beta])F[\beta, \beta]^{-1} + u[\epsilon]A^{u(\beta)},$$

$$A^{u(\beta)}_{(|\epsilon|\times|\beta|)} = F[\epsilon, \beta]F[\beta, \beta]^{-1},$$

wherein u[β] represents the fourth portion of the input vector.

8. The storage system of claim 7, wherein the fifth portion of the input vector and the sixth portion of the input vector are determined as follows:

$$u[\phi]=f^{(\phi)},$$

$$u[\gamma]=f^{(\gamma)},$$

wherein u[φ] represents the fifth portion of the input vector, and u[γ] represents the sixth portion of the input vector.

9. A device for encoding information bits for storage in a storage device, the device comprising:
a memory interface configured to communicate with the storage device; and
at least one processor configured to:
obtain an information vector comprising a plurality of information bits, a static frozen vector comprising a plurality of static frozen bits, and a constraints vector which indicates at least one constraint;
partition the information vector into a first information vector and a second information vector;
partition the static frozen vector into a first static frozen vector and a second static frozen vector;
determine an input vector by applying a plurality of matrix operations to the first information vector, the second information vector, the first static frozen vector, the second static frozen vector, and the constraints vector;
compute an output codeword of a polar subcode based on the input vector; and
control the memory interface to transmit the output codeword to the storage device.

10. The device of claim 9, wherein information bits included in the first information vector are included in the output codeword at positions which are bit-reversed with respect to the first information vector, and wherein information bits included in the second information vector are included in the output codeword at positions which are bit-reversed with respect to the second information vector.

11. The device of claim 9, wherein the output codeword is a Polar codeword which satisfies:

$$uP=d,$$

where u represents the input vector, P represents a constraints matrix, and d represents the constraints vector.

12. The device of claim 11, wherein a first portion of the input vector is determined as follows:

$$u[\alpha]=i^{(\alpha)}F[\alpha,\alpha],$$

wherein α represents a first information index set which indicates information vector indexes which are not dominated by static frozen vector indexes, u[α] represents the first portion of the input vector, $i^{(\alpha)}$ represents the first information vector, F represents a polar generator kernel, and F[α, α] represents a first submatrix of the polar generator kernel which includes rows of the polar generator kernel having the first information index set and columns of the polar generator kernel having the first information index set.

13. The device of claim 12, wherein an updated constraints vector is determined as follows:

$$\tilde{d} = d + u[\alpha]A^{d(\alpha)} + i^{(\beta)}A^{d(\beta)} + f^{(\phi)}P[\phi, :] + f^{(\gamma)}P[\gamma, :],$$

$$A^{d(\alpha)}_{(|\alpha|\times L)} = P[\alpha, :] + A^{\alpha,\beta}P[\beta, :],$$

$$A^{\alpha,\beta}_{(|\alpha|\times|\beta|)} = F[\alpha, \beta]F[\beta, \beta]^{-1},$$

$$A^{d(\beta)}_{(|\beta|\times L)} = F[\beta, \beta]^{-1}P[\beta, :]$$

wherein β represents a second information index set which indicates information vector indexes which are dominated by the static frozen vector indexes, φ represents a first frozen index set which indicates static frozen vector indexes which do not dominate the information vector indexes, and γ represents a second frozen index set which indicates static frozen vector indexes which dominate the information vector indexes, wherein $\tilde{d}$ represents the updated constraints vector, $i^{(\beta)}$ represents the second information vector, $f^{(\phi)}$ represents the first static frozen vector, and $f^{(\gamma)}$ represents the second static frozen vector, wherein P[φ, :] represents a first submatrix of the constraints matrix which includes rows of the constraints matrix having the first frozen index set, P[γ, :] represents a second submatrix of the constraints matrix which includes rows of the constraints matrix having the second frozen index set, P[α, :] represents a third submatrix of the constraints matrix which includes rows of the constraints matrix having the first information index set, and P[β, :] represents a fourth submatrix of the constraints matrix which includes rows of the constraints matrix having the second information index set, and wherein F[α, β] represents a second submatrix of the polar generator kernel which includes rows of the polar generator kernel having the first information index set and columns of the polar generator kernel having the second information index set, and F[β, β]$^{-1}$ represents an inverse of a third submatrix of the polar generator kernel which includes rows of the polar generator kernel having the second information index set and columns of the polar generator kernel having the second information index set.

14. The device of claim 13, wherein the at least one processor is further configured to obtain a dynamic frozen vector comprising a portion of the plurality of information bits which are removed from the information vector based on the at least one constraint, and
wherein a second portion of the input vector and a third portion of the input vector are determined as follows:

$$[u[\delta], u[\epsilon]] = \tilde{d} B^{\epsilon,\delta},$$

$$B^{\epsilon,\delta}_{(L \times L)} = \begin{bmatrix} P[\delta, :] \\ F[\epsilon, \beta]F[\beta, \beta]^{-1}P[\beta, :] + P[\epsilon, :] \end{bmatrix}^{-1},$$

wherein δ represents a first set of dynamic frozen vector indexes which do not dominate the information vector indexes, ϵ represents a second set of dynamic frozen vector indexes which dominate the information vector indexes,
wherein u[δ] represents the second portion of the input vector, and u[ϵ] represents the second portion of the input vector,
wherein P[δ, :] represents a fifth submatrix of the constraints matrix which includes rows of the constraints matrix having the first set of dynamic frozen vector indexes, P[ϵ, :] represents a sixth submatrix of the constraints matrix which includes rows of the constraints matrix having the second set of dynamic frozen vector indexes, and
wherein F[ϵ, β] represents a fourth submatrix of the polar generator kernel which includes rows of the polar generator kernel having the second set of dynamic frozen vector indexes and columns of the polar generator kernel having the second information index set.

15. The device of claim 14, wherein a fourth portion of the input vector is determined as follows:

$$u[\beta] = u[\alpha]A^{\alpha,\beta} + (i^{(\beta)} + f^{(\gamma)}F[\gamma, \beta])F[\beta, \beta]^{-1} + u[\epsilon]A^{u(\beta)},$$

$$A^{u(\beta)}_{(|\epsilon| \times |\beta|)} = F[\epsilon, \beta]F[\beta, \beta]^{-1},$$

wherein u[β] represents the fourth portion of the input vector.

16. The device of claim 15, wherein a fifth portion of the input vector and a sixth portion of the input vector are determined as follows:

$$u[\phi] = f^{(\phi)},$$

$$u[\gamma] = f^{(\gamma)},$$

wherein u[ϕ] represents the fifth portion of the input vector, and u[γ] represents the sixth portion of the input vector.

17. A method of controlling a storage system, the method being executed by at least one processor and comprising:

obtaining an information vector comprising a plurality of information bits, a static frozen vector comprising a plurality of static frozen bits, and a constraints vector which indicates at least one constraint;
partitioning the information vector into a first information vector and a second information vector;
partitioning the static frozen vector into a first static frozen vector and a second static frozen vector;
determining a first portion of an input vector based on the first information vector;
determining an updated constraints vector based on the constraints vector, the first portion of the input vector, the second information vector, the first static frozen vector, and the second static frozen vector;
determining a second portion of the input vector and a third portion of the input vector based on the updated constraints vector;
determining a fourth portion of the input vector based on the first portion of the input vector, the second information vector, the second static frozen vector, and the third portion of the input vector;
determining a fifth portion of the input vector based on the first static frozen vector;
determining a sixth portion of the input vector based on the second static frozen vector;
computing an output codeword based on the input vector; and
storing the output codeword in the storage device.

18. The method of claim 17, wherein information bits included in the first information vector are included in the output codeword at positions which are bit-reversed with respect to the first information vector, and
wherein information bits included in the second information vector are included in the output codeword at positions which are bit-reversed with respect to the second information vector.

19. The method of claim 17, wherein the output codeword is a Polar codeword which satisfies:

$$uP=d,$$

where u represents the input vector, P represents a constraints matrix, and d represents the constraints vector.

20. The method of claim 19, wherein the first portion of the input vector is determined as follows:

$$u[\alpha]=i^{(\alpha)}F[\alpha,\alpha],$$

wherein α represents a first information index set which indicates information vector indexes which are not dominated by static frozen vector indexes, u[α] represents the first portion of the input vector, $i^{(\alpha)}$ represents the first information vector, F represents a polar generator kernel, and F[α, α] represents a first submatrix of the polar generator kernel which includes rows of the polar generator kernel having the first information index set and columns of the polar generator kernel having the first information index set.

* * * * *